US009245630B2

(12) United States Patent
Kwak et al.

(10) Patent No.: US 9,245,630 B2
(45) Date of Patent: Jan. 26, 2016

(54) MEMORY SYSTEM COMPRISING NONVOLATILE MEMORY DEVICE AND PROGRAM METHOD THEREOF

(71) Applicants: Donghun Kwak, Hwaseong-si (KR); Kitae Park, Seongnam-si (KR)

(72) Inventors: Donghun Kwak, Hwaseong-si (KR); Kitae Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/161,886

(22) Filed: Jan. 23, 2014

(65) Prior Publication Data

US 2014/0219020 A1    Aug. 7, 2014

(30) Foreign Application Priority Data

Feb. 4, 2013    (KR) .......................... 10-2013-0012514

(51) Int. Cl.
  *G11C 16/04*    (2006.01)
  *G11C 16/10*    (2006.01)
  *G11C 11/56*    (2006.01)
  *G11C 16/22*    (2006.01)

(52) U.S. Cl.
  CPC ............ *G11C 16/10* (2013.01); *G11C 11/5628* (2013.01); *G11C 16/22* (2013.01)

(58) Field of Classification Search
  CPC ........... G11C 11/5628; G11C 11/5642; G11C 11/5621
  USPC ........................... 365/185.03, 189.01, 185.09
  IPC ..................... G11C 11/5628, 11/5642, 11/5621
  See application file for complete search history.

(56) References Cited

U.S. PATENT DOCUMENTS

| 7,366,013 | B2 | 4/2008 | Roohparvar |
| 7,518,914 | B2 | 4/2009 | Han |
| 7,773,418 | B2 | 8/2010 | Aritome |
| 7,843,728 | B2 | 11/2010 | Honda et al. |
| 8,223,541 | B2 | 7/2012 | Shirota |
| 8,266,503 | B2 | 9/2012 | Wood et al. |
| 8,270,214 | B2 | 9/2012 | Shibata et al. |
| 2007/0025151 | A1* | 2/2007 | Lee .......................... 365/185.11 |
| 2007/0211530 | A1 | 9/2007 | Nakano |
| 2008/0198651 | A1* | 8/2008 | Kim .......................... 365/185.03 |
| 2011/0107021 | A1* | 5/2011 | Muthukumarasamy ...... 711/104 |
| 2012/0039122 | A1 | 2/2012 | Park et al. |
| 2013/0080730 | A1* | 3/2013 | Kim .............................. 711/203 |

FOREIGN PATENT DOCUMENTS

| JP | 4805696 B2 | 8/2011 |
| JP | 2011-198408 A | 10/2011 |
| JP | 2012-027806 A | 2/2012 |
| KR | 10-2011-0001098 A | 1/2011 |

\* cited by examiner

*Primary Examiner* — Connie Yoha
(74) *Attorney, Agent, or Firm* — Volentine & Whitt, PLLC

(57) ABSTRACT

A memory system includes a nonvolatile memory device, and a memory controller configured to control the nonvolatile memory device such that memory cells connected with a selected row of the nonvolatile memory device are programmed by one of a first program mode and a second program mode. At the first program mode, a plurality of logical pages corresponding in number to a maximum page number is stored at the memory cells, and at the second program mode, one or more logical pages the number of which is less than the maximum page number are stored at the memory cells using a bias condition that is different from that used in the first program mode.

19 Claims, 30 Drawing Sheets

Fig. 9

| Word Line | Page Address | |
|---|---|---|
| | LSB(1st Page) | MSB(2nd Page) |
| WL8 | – | – |
| WL3 | 6 | 7 |
| WL2 | Map out | 5 |
| WL1 | 3 | 4 |
| WL0 | 1 | 2 |

Fig. 12B

| Word Line | Page Address | | |
|---|---|---|---|
| | 1st Page | 2nd Page | 3rd Page |
| WL8 | - | - | - |
| WL3 | 8 | 9 | 10 |
| WL2 | 7 | Map out | Map out |
| WL1 | 4 | 5 | 6 |
| WL0 | 1 | 2 | 3 |

Fig. 13B

| Word Line | Page Address | | |
|---|---|---|---|
| | 1st Page | 2nd Page | 3rd Page |
| WL8 | - | - | - |
| WL3 | 8 | 9 | 10 |
| WL2 | Map out | Map out | 7 |
| WL1 | 4 | 5 | 6 |
| WL0 | 1 | 2 | 3 |

Fig. 15B

| Word Line | Page Address | | | |
|---|---|---|---|---|
| | 1st Page | 2nd Page | 3rd Page | 4th Page |
| WL8 | - | - | - | - |
| WL3 | 10 | 11 | 12 | 13 |
| WL2 | 9 | Map out | Map out | Map out |
| WL1 | 5 | 6 | 7 | 8 |
| WL0 | 1 | 2 | 3 | 4 |

Fig. 16B

| Word Line | Page Address | | | |
|---|---|---|---|---|
| | 1st Page | 2nd Page | 3rd Page | 4th Page |
| WL8 | - | - | - | - |
| WL3 | 11 | 12 | 13 | 14 |
| WL2 | Map out | Map out | 9 | 10 |
| WL1 | 5 | 6 | 7 | 8 |
| WL0 | 1 | 2 | 3 | 4 |

MEMORY SYSTEM COMPRISING NONVOLATILE MEMORY DEVICE AND PROGRAM METHOD THEREOF

CROSS-REFERENCE TO RELATED APPLICATIONS

A claim for priority under 35 U.S.C. §119 is made to Korean Patent Application No. 10-2013-0012514 filed Feb. 4, 2013, in the Korean Intellectual Property Office, the entire contents of which are hereby incorporated by reference.

BACKGROUND

The inventive concepts described herein relate to semiconductor memories, and more particularly, to memory systems including nonvolatile memory and to methods of programming executed by memory systems including nonvolatile memory.

Semiconductor memory devices may be volatile or nonvolatile. Volatile semiconductor memory devices are generally characterized by the loss of contents stored in a power-off state, whereas nonvolatile semiconductor memory devices are generally characterized by the retention of contents stored even in a power-off state.

Flash memory is one example of a nonvolatile semiconductor memory device which has been widely adopted in electronics industries. Flash memory may be used to store large quantities of voice, image data and other data in information appliances such as a computer, a cellular phone, a PDA, a digital camera, a camcorder, a voice recorder, an MP3 player, a handheld PC, a game machine, a facsimile, a scanner, a printer, and the like.

In the meantime, in an effort to meet the continuing demand for highly integrated memory devices, research has focused on the development of nonvolatile memory devices (hereinafter, referred to as a three-dimensional (3D) nonvolatile memory devices) where memory cells are arranged in three-dimensions. Interference between word lines is a particular concern that must be addressed in the design of 3D nonvolatile memory devices. However, charge trap flash (CTF) memory cells are may be utilized to increase a cell size, which can mostly elevate word line interference. This may allow for multi-bit data to be programmed at a memory cell in a so-called one-shot program mode where multiple data bits are simultaneously programmed at the memory cell, as opposed to a shadow program mode where 1-bit data is programmed at a time at the memory cell.

SUMMARY

One aspect of embodiments of the inventive concept is directed to provide a memory system which includes a nonvolatile memory device configured to program memory cells with multi-bit data during a program cycle, and a memory controller configured to control the nonvolatile memory device such that memory cells connected with a selected row of the nonvolatile memory device are programmed in accordance with a write command by one of a first program mode and a second program mode. At the first program mode, a plurality of logical pages corresponding in number to a maximum page number is stored at the memory cells, and at the second program mode, one or more logical pages the number of which is less than the maximum page number are stored at the memory cells using a bias condition that is different from that used in the first program mode.

Another aspect of embodiments of the inventive concept is directed to provide a memory system which includes a nonvolatile memory device including a memory cell array and configured to program logical N-pages of data in memory cells connected to a same word line of the memory cell array, where N is an integer of two or more. The memory system further includes a memory controller configured to receive an externally supplied write command and write requested data, and to control the nonvolatile memory device in a selected one of a normal program mode and a pseudo program mode. In the normal program mode, the memory controller controls the nonvolatile memory to store the write requested data as N-bit data in the memory cells connected to the same word line of the memory cell array. In the pseudo program mode, the memory controller controls the nonvolatile memory to store the write requested data as less-than-N-bit data in the memory cells connected to the same word line of the memory cell array. At least one bias condition of the pseudo program mode is different from at least one bias condition of the normal program mode such that a program speed of the pseudo program mode is greater than that of the normal program mode.

Still another aspect of embodiments of the inventive concept is directed to provide a memory system which includes a nonvolatile memory device including a first memory region formed of single level cells and a second memory region formed of multi-level cells, and a memory controller configured to control the nonvolatile memory device such that data provided from an external device is stored at the first memory region and data stored at the first memory region is programmed at the second memory region according to a first program mode. The memory controller is configured to control the nonvolatile memory device such that write requested data is stored at the second memory region under a second program mode, based on whether the first memory region is at an erase state. A plurality of page data is stored at a selected memory unit during a program cycle at the first program mode and data less in size than the plurality of page data is programmed at the selected memory unit at the second program mode, a programming speed of the second program mode being higher than that of the first program mode.

Yet another aspect of embodiments of the inventive concept is to provide a program method of a nonvolatile memory device which programs plural pages of data in a one-shot program mode. The method includes comparing a size of write requested data with a reference size, issuing a pseudo program command on the write requested data to the nonvolatile memory device when a size of write requested data is smaller than the reference size, programming selected memory cells with the write requested data under a pseudo program mode in accordance with the pseudo program command, and mapping out a page address of a logical page area, excluded by the pseudo program mode, from among a plurality of logical page areas included in the selected memory cells at a mapping table. A program state of memory cells formed according to the pseudo program mode has a characteristic threshold voltage distribution that is different from a characteristic threshold voltage distribution formed according to the one-shot program mode.

Another aspect of embodiments of the inventive concept is to provide a program method of a nonvolatile memory device. The nonvolatile memory device includes a first memory region and a second memory region, data being programmed at the second memory region according to a one-shot program mode. The program method includes receiving write data, and determining whether the first memory region is at an erase state. The method further includes, when the first memory region is determined not to be at an erase state, programming the write data at selected memory cells of the second memory region according to a pseudo program mode without buffering of the write data in the first memory region, and mapping out a page address of a logical page area, excluded by the pseudo program mode, from among a plurality of logical page areas included in the selected memory cells at a mapping table. A threshold voltage distribution of the selected memory cells formed according to the pseudo program mode includes an erase state and at least one pseudo program state, the at least one pseudo program state corresponding to a widest voltage window of read voltages of an allocated logical page.

BRIEF DESCRIPTION OF THE FIGURES

The above and other aspects and features will become apparent from the detailed description that follows with reference to the accompanying figures, wherein like reference numerals refer to like parts throughout the various figures unless otherwise specified, and wherein:

FIG. 9 is a table schematically illustrating an example of a mapping table of FIG. 1;

FIGS. 12A and 12B are diagrams for reference in describing an example of a pseudo program method on 3-bit multi-level cells;

FIGS. 13A and 13B are diagrams for reference in describing another example of a pseudo program method on 3-bit multi-level cells;

FIGS. 15A and 15B are diagrams for reference in describing an example of a pseudo program method on 4-bit multi-level cells;

FIGS. 16A and 16B are diagrams for reference in describing another example of a pseudo program method on 4-bit multi-level cells;

DETAILED DESCRIPTION

Figure 1:
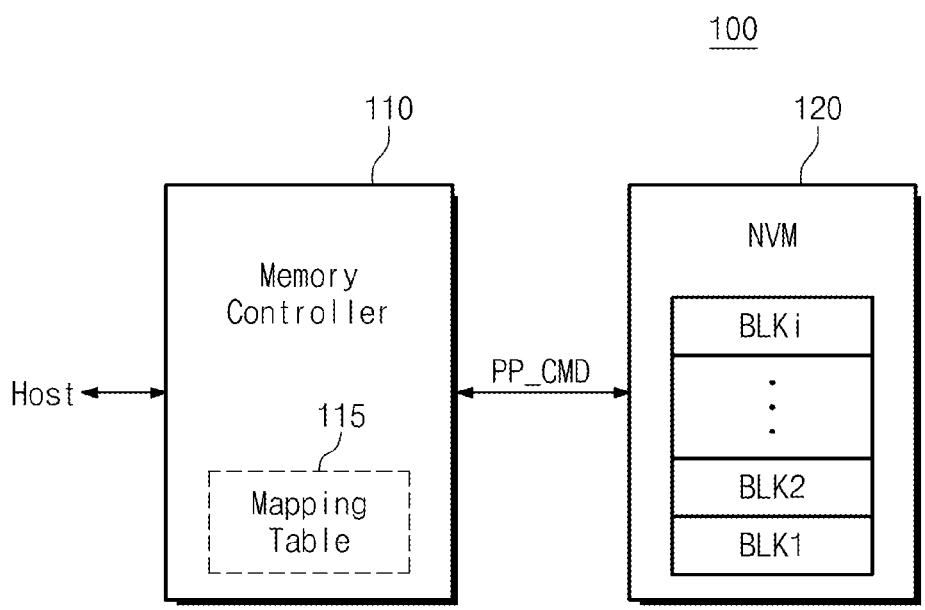
FIG. 1 is a block diagram schematically illustrating a memory system according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Below, features and functions of the inventive concept will be exemplarily described using a flash memory device as a nonvolatile storage medium. However, the inventive concept is not limited thereto. That is, the storage medium may be formed of other nonvolatile memory devices. For example, the storage medium may be formed of a PRAM, an MRAM, a ReRAM, a FRAM, a NOR flash memory, or the like.

The inventive concept may be implemented by different embodiments or applied thereto. Further, detailed description may be modified or changed according to viewpoints and applications without escaping from the scope, spirit and other objects of the inventive concept. Below, the inventive concept will be described with reference to accompanying drawings.

FIG. 1 is a block diagram schematically illustrating a memory system according to an embodiment of the inventive concept. Referring to FIG. 1, a memory system 100 may include a memory controller 110 and a nonvolatile memory device 120.

The memory controller 110 may control the nonvolatile memory device 120 in response to a request of a host. The memory controller 110 may provide an interface between the host and the nonvolatile memory device 120. The memory controller 110 may control a write operation of the nonvolatile memory device 120 in response to a write request of the host. The memory controller 110 may control a read operation of the nonvolatile memory device 120 in response to a read request of the host.

The memory controller 110 may drive a flash translation layer (hereinafter, referred to as FTL) which is a type of firmware. The FTL may provide an interface for hiding an erase operation of the nonvolatile memory device 120 between a file system of the host and the nonvolatile memory device 120. The FTL may compensate for characteristic drawback of the nonvolatile memory device 120 such as erase-before-write, mismatch between an erase unit and a write unit, and so on. Also, at a write operation of the nonvolatile memory device 120, the FTL may map a logical address LA generated by the file system on a physical address PN of the nonvolatile memory device 120. The memory controller 110 may include a mapping table 115 for such address mapping.

The memory controller 110 may select one of a plurality of program modes according to a size of data write requested by the host. The memory controller 110 may select a pseudo program mode when a size of data write requested is less than a reference value. The memory controller 110 may select a normal program mode when a size of data write requested is more than the reference value. Here, the reference value may correspond to a data size which is less than that of a program unit of a one-shot program mode. For example, if one program unit corresponds to 3 pages of data, the reference value may correspond to 2 pages of data or 1 page of data.

When the pseudo program mode is selected, the memory controller 110 may issue a pseudo program command PP_CMD to the nonvolatile memory device 120. When the normal program mode is selected, the memory controller 110 may issue a normal program command NP_CMD to the nonvolatile memory device 120 such that write requested data is programmed according to a normal program mode where a program unit (e.g., corresponding to three pages) is utilized.

The nonvolatile memory device 120 may perform an erase operation, a read operation, and a write operation according to a control of the memory controller 110. The nonvolatile memory device 120 may include a plurality of memory blocks BLK1 to BLKi (i being an integer of 2 or more). Each memory block may include a plurality of memory cells arranged in rows and columns. Each memory cell may be a multi-level cell (MLC) capable of storing multiple bits. In the nonvolatile memory device 120, each memory block may be an erase unit. Each memory block may include NAND cell strings in which memory cells are stacked in a direction crossing with a substrate.

The nonvolatile memory device 120 may program input data at selected memory cells at relatively high speed in response to the pseudo program command PP_CMD. Write data provided with the pseudo program command PP_CMD may be programmed at selected memory cells in high speed. That is, at the pseudo program mode, a program operation may be executed under a bias condition that is different from that of a normal program mode. For example, a program loop number, a start program voltage, a level of a step voltage of an incremental step pulse programming (ISPP) scheme, etc. at the pseudo program mode may be different from that at the normal program mode.

With an embodiment of the inventive concept, it is possible to program nonvolatile memory cells with a relatively small size of data (e.g., metadata) write requested by a random pattern. Data to be stored at nonvolatile memory cells may be programmed without setting up a program unit for one-shot programming. In this case, it is possible to minimize data loss in the event of a sudden power-off. In addition, it is possible to decide whether to execute the pseudo program mode according to a relative importance and attributes of write requested data.

Figure 2:
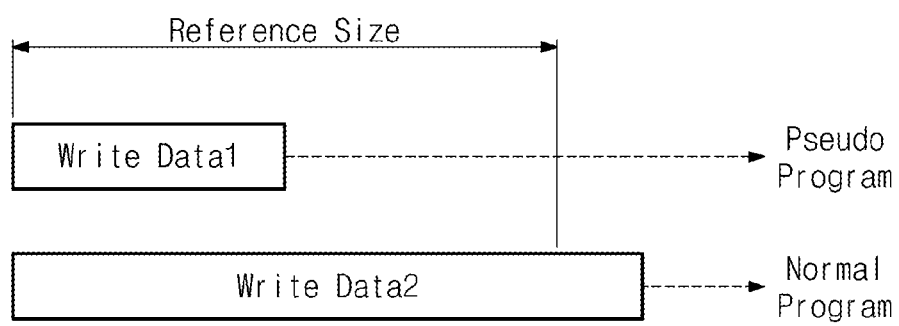
FIG. 2 is a diagram for reference in describing an example of a program mode deciding method of a controller of FIG. 1.

FIG. 2 is a diagram for reference in describing a program mode deciding method of a controller of FIG. 1. Referring to FIG. 2, a memory controller 110 may decide a program mode of a nonvolatile memory device 120 based on a size of write requested data.

If a size of the write requested data Write Data1 is less than a reference size, the memory controller may select a pseudo program mode. If a size of the write requested data Write Data2 is more than the reference size, the memory controller may select a normal program mode.

In FIG. 2, there is illustrated an example a program mode of write requested data is decided according to a size of the write requested data. However, the inventive concept is not limited thereto. For example, as suggested above, the program mode may be decided based on a relative importance, attributes and/or input pattern of the write data. For example, data having low importance not requiring fast programming may be programmed according to a normal program mode even though a size of the data is small.

Figure 3:
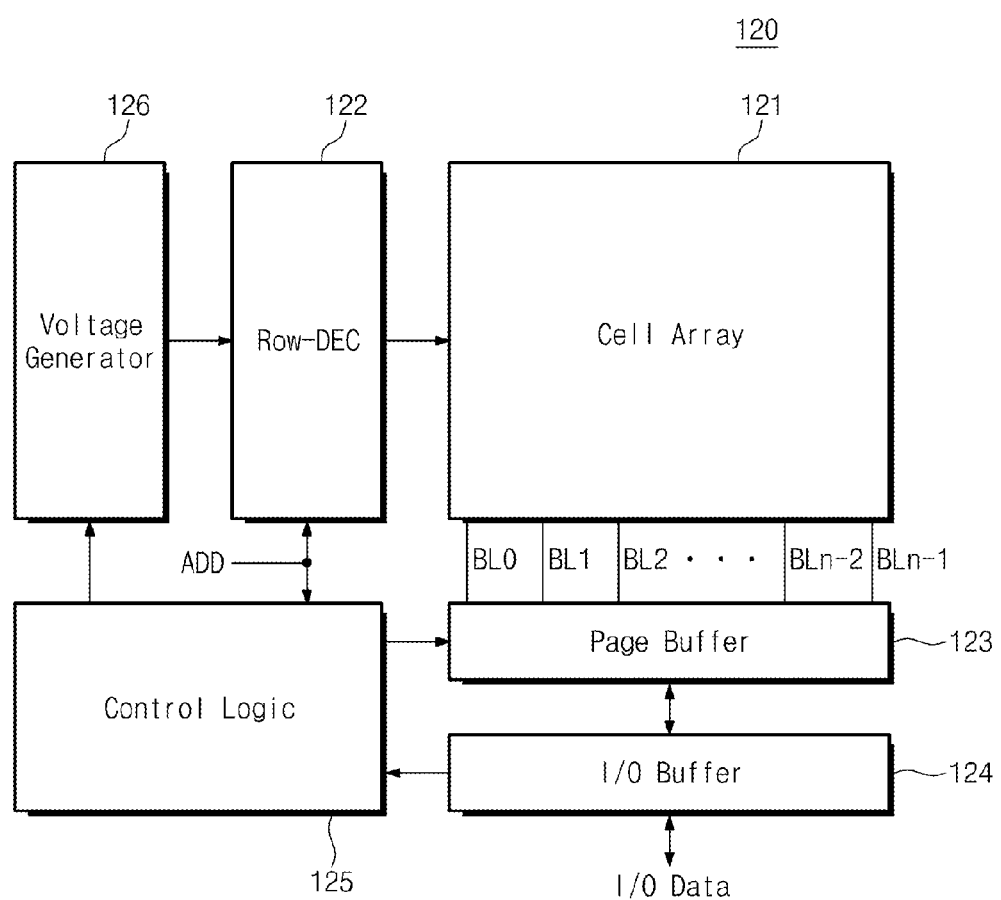
FIG. 3 is a block diagram schematically illustrating a nonvolatile memory device according to an embodiment of the inventive concept.

FIG. 3 is a block diagram schematically illustrating a nonvolatile memory device according to an embodiment of the inventive concept. Referring to FIG. 3, a nonvolatile memory device 100 may include a cell array 121, a row decoder 122, a page buffer 123, an input/output buffer 124, control logic 125, and a voltage generator 126.

The cell array 121 may be connected to the row decoder through word lines and selection lines. The cell array 121 may be connected to the page buffer 123 through bit lines BL0 to BLn−1. The cell array 121 may include a plurality of NAND cell strings, each of which forms a channel in a vertical or horizontal direction. The word lines of the cell array 121 may be stacked in a vertical direction. In particular, in a nonvolatile memory device where cell strings are formed in a vertical direction, memory cells may be programmed using a one-shot program mode where multiple bits are programmed within a program cycle. In this case, a flag cell indicating that multi-bit data is stored may be unnecessary.

The row decoder 122 may select one of the memory blocks in response to an address ADD. The row decoder 122 may select one of word lines of the selected memory block. The row decoder 122 may provide the selected word line with a voltage from the voltage generator 126. At a program operation, the row decoder 122 may transfer a program or verification voltage to a selected word line and a pass voltage to an unselected word line(s).

At a program operation, the page buffer 123 may provide the bit lines BL0 to BLn−1 of the cell array 121 with bit line voltages corresponding to data to be programmed. At a read operation, the page buffer 123 may sense and latch data stored at selected memory cells through the bit lines BL0 to BLn−1. The page buffer 123 may transfer the latched data to the input/output buffer 124.

At a program operation, the input/output buffer 124 may transfer write data to the page buffer 123. At a read operation, the input/output buffer 124 may output read data provided from the page buffer 123 to an external device. The input/output buffer 124 may provide an input address or command to the control logic 125 or the row decoder 122.

The control logic 125 may control the page buffer 123 and the voltage generator 126 in response to a command CMD and an address ADD transferred through the input/output buffer 124. The control logic 125 may control the voltage generator 126 in response to a program command to generate a bias according to different modes. For example, in response to a pseudo program command PP_CMD, the control logic 125 may control the voltage generator 126 to generate a coarse program voltage to be provided to a selected word line. In response to a normal program command NP_CMD, the control logic 125 may control the voltage generator 126 to generate a fine program voltage.

The voltage generator 126 may be controlled by the control logic 125, and may generate word line voltages to be provided to word lines, a voltage to be supplied to a bulk where memory cells are formed, and so on. The word line voltages may include a program voltage, a pass voltage, selection and non-selection voltages, and so on. The voltage generator 126 may generate the coarse program voltage and the fine program voltage in response to a control of the control logic 125.

The coarse program voltage may be a program voltage having a relatively high start level or an ISPP (Incremental Step Pulse Programming) voltage where a step voltage between program pluses is large. Alternatively, the coarse program voltage may be a program voltage determined such that a relatively low number of program loops is used. That is, the coarse program voltage may be a voltage determined such that the number of program verification pulses is reduced. On the other hand, the fine program voltage may be an ISPP voltage for forming a distribution of selected memory cells optimally. In addition, verification voltage pulses on all program states may be included in the fine program voltage.

The nonvolatile memory device 120 may generate different program voltages according to a program command of the memory controller 110. That is, in response to the pseudo program command PP_CMD, the nonvolatile memory device 120 may program write data at a selected memory unit in high speed. It is possible to program a selected memory unit with a small size of data in high speed through the pseudo program operation.

Figure 4:
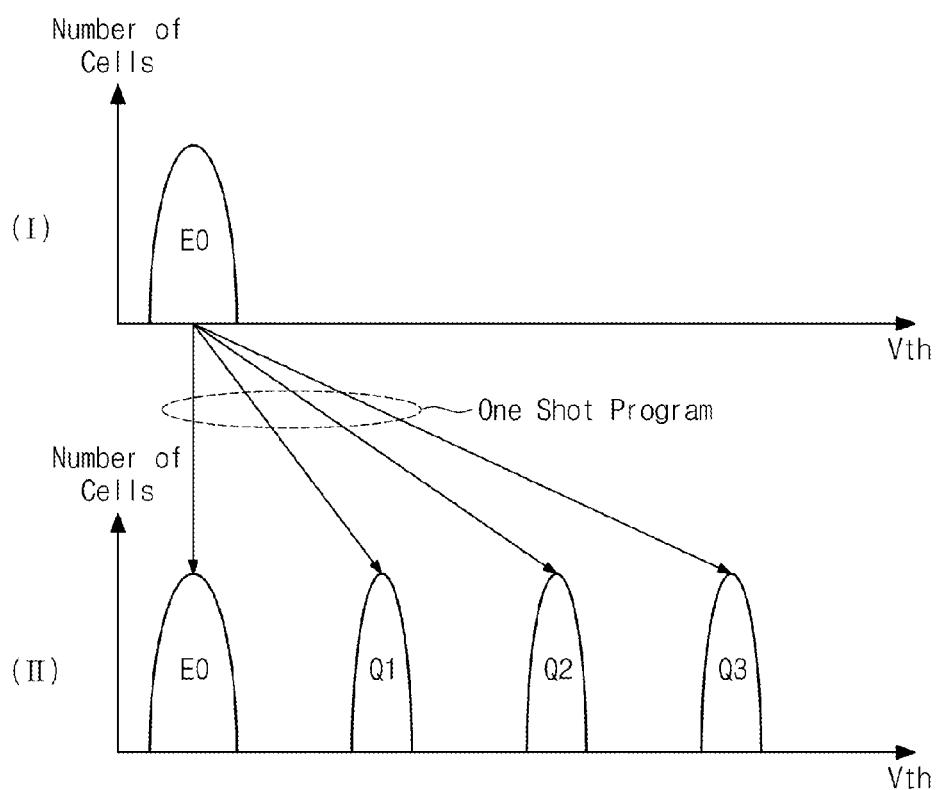
FIG. 4 is a diagram for reference in describing an example of a one-shot program operation according to an embodiment of the inventive concept.

FIG. 4 is a diagram for reference in describing a one-shot program operation according to an embodiment of the inventive concept. Referring to FIG. 4, (I) may show a threshold voltage state of memory cells before programming, and (II) may show threshold voltage distributions of memory cells respectively corresponding to program states after one-shot programming.

Referring to an upper portion (I) of FIG. 4, all memory cells not programmed may have threshold voltages corresponding to an erase state E0. Selected memory cells may have threshold voltages corresponding to an erase state E0 through an erase operation. If a maximum size of data selected memory cells are capable of storing is received, a one-shot program operation may be executed.

The one-shot program operation may be a program operation where multi-bit data to be stored at a multi-bit cell is programmed through a program cycle. That is, in case of a 2-bit multi-level cell, 2-bit data may be programmed during a program cycle through the one-shot program operation. One program cycle may be formed of a plurality of increasing program pulses and verification voltages respectively corresponding to target states Q1, Q2, and Q3 following the respective program pulses. That is, the one-shot program operation may be distinguishable from a shadow program operation where 1-bit data is stored at a multi-level cell at a program cycle.

The one-shot program technique may be applicable to a vertical nonvolatile memory device where interference (e.g., program disturbance) between word lines is not problematic. In a multi-level cell programming mode of the inventive concept, a program mode of the nonvolatile memory device 120 performed in response to a normal program command NP_CMD may be the one-shot program mode.

Figure 5:
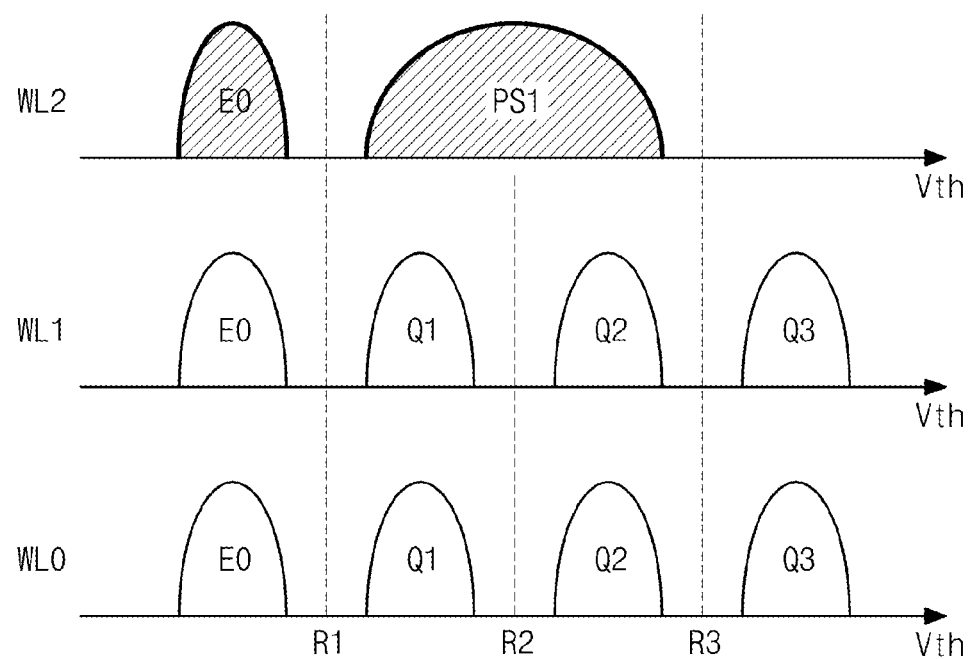
FIG. 5 is a diagram for reference in describing an example of a pseudo program method according to an embodiment of the inventive concept.

FIG. 5 is a diagram for reference in describing a pseudo program method according to an embodiment of the inventive concept. In the example of FIG. 5, nonvolatile memory cells of the inventive concept may be programmed by a word line unit, and each nonvolatile memory cell may store 2-bit data.

It is assumed that memory cells connected with word lines WL0 to WL1 are programmed with 2-bit data through a one-shot program operation. With this assumption, each of memory cells connected with word lines WL0 to WL1 may have a threshold voltage corresponding to one of four threshold voltage states E0, Q1, Q2, and Q3 through the one-shot program operation. In the event that input data is programmed through a pseudo program operation under judgment of a memory controller 110, 1-bit data may be programmed at each memory cell connected with a word line WL2 in high speed.

When the memory cells connected with a word line WL2 are programmed according to the pseudo program operation, control logic 125 (refer to FIG. 3) may control a voltage generator 126 (refer to FIG. 3) to generate a voltage having a level which is different from that at a normal program operation. The voltage generator 126 may provide the memory cells connected with the word line WL2 with a word line voltage for the pseudo program operation capable of performing a high-speed program operation. With the pseudo program operation, it is possible to control a voltage relatively roughly. The reason for this may be that a target threshold voltage PS1 is between read voltages R1 and R3. For example, program pulses provided at the pseudo program operation may be determined such that the number of program loops is relatively small or a start program voltage is relatively high. The pseudo program operation may only necessitate verification pulses corresponding to the target threshold voltage PS1. Thus, the number of verification pulses at the pseudo program operation may be less than that at a normal program operation. This may mean that a speed of the pseudo program operation is significantly faster than that of the normal program operation.

Memory cells programmed according to the pseudo program operation may be read using read voltages R1 and R3 for reading an MSB page. Since an LSB page stored at the memory cells connected with the word line WL2 are mapped out from a mapping table 115, data read by the read voltages R1 and R3 may be output as valid data. As a result, memory cells programmed through the pseudo program operation may be sensed by an MSB page read operation.

An MSB page stored at the memory cells connected with the word line WL2 may be read by performing a sensing operation using the read voltage R1 and a sensing operation using the read voltage R2. Finally, data written through the pseudo program operation may be read using the read voltage R1.

Figure 6:
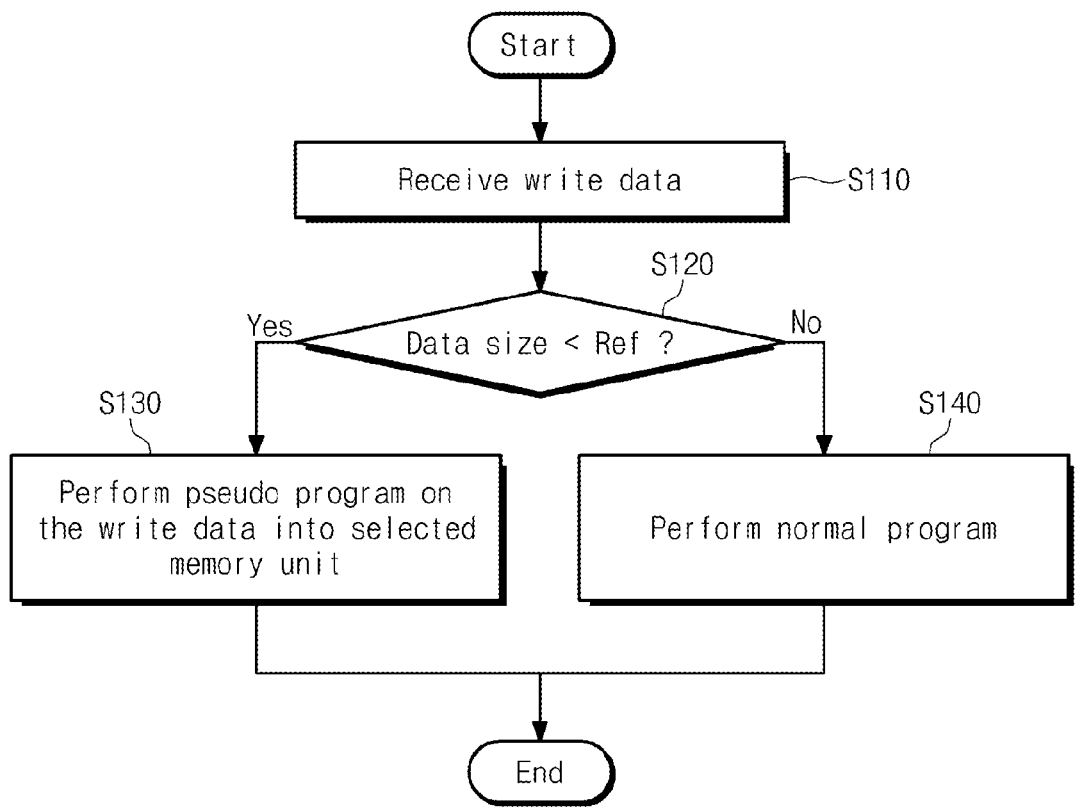
FIG. 6 is a flow chart for reference in describing an example of an operation of a memory controller according to an embodiment of the inventive concept.

FIG. 6 is a flow chart for reference in describing an operation of a memory controller according to an embodiment of the inventive concept. In the example of this embodiment, a memory controller 110 may select either a pseudo program operation or a normal program operation in response to a write request of a host.

In operation S110, if a write operation is requested, the memory controller 110 may receive write requested data. Here, the write operation may be requested by a host. However, the inventive concept is not limited thereto. For example, a write operation associated with a relatively small size of data may be requested by an internal operation of the memory controller 110.

In operation S120, the memory controller 110 may determine whether a size of the write requested data is less than a reference size. If a size of the write requested data is less than the reference size, the method may proceed to operation S130. If a size of the write requested data is equal to or more than the reference size, the method may proceed to operation S140.

In operation S130, the memory controller 110 may program the write requested data at a nonvolatile memory device 120 according to a pseudo program operation. That is, the memory controller 110 may issue a separate command sequence to program the write requested data at a selected area of the nonvolatile memory device 120. In response to a pseudo program command PP_CMD, the nonvolatile memory device 120 may perform a high-speed program operation using a bias condition which is different from that of a normal program operation. Then, the memory controller 110 may record one or more addresses, mapped out due to the pseudo program operation, from among page addresses of a selected memory unit at a mapping table 115.

In operation S140, the memory controller 110 may program the write requested data according to a normal program operation. The memory controller 110 may issue a normal program command NP_CMD to the nonvolatile memory device 120 to program the write requested data at the selected memory unit. In response to the normal program command NP_CMD, the nonvolatile memory device 120 may program the selected memory unit through a one-shot program operation. That is, during a program cycle, the selected memory unit (i.e., memory cells connected with a word line) may be programmed with pages of data.

Described herein are examples where a program mode on write requested data is determined based on a data size. However, the inventive concept is not limited thereto. For example, an input pattern and/or attribute and/or relative importance of data may be used as a reference for determining the above-described program mode.

Figure 7:
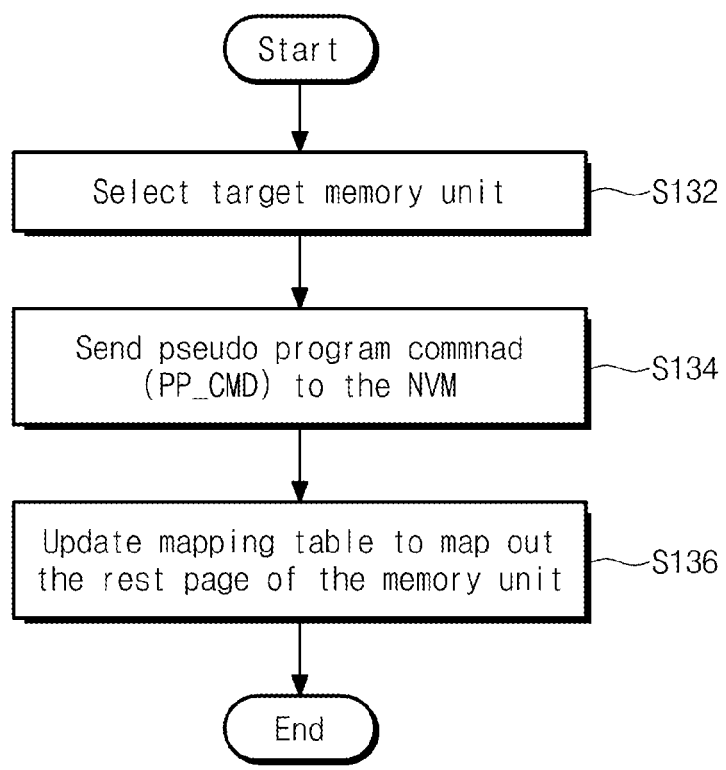
FIG. 7 is a flow chart for reference in describing an example of an operation of a memory controller performing a pseudo program operation described with reference to FIG. 6.

FIG. 7 is a flow chart for reference in describing an operation of a memory controller performing a pseudo program operation described with reference to FIG. 6. Here, as will be described below, a memory controller 110 may map addresses for a pseudo program operation using a mapping table 115.

In operation S132, as a pseudo program operation is determined, the memory controller 110 may select a memory unit at which write data is to be stored. Memory units of a nonvolatile memory device 120 may be sequentially programmed according to locations of word lines. However, in the event that the pseudo program operation is determined, at least one of page areas (e.g., MSB and LSB pages) of memory cells connected with a word line may be invalidated.

In operation S134, the memory controller may send a pseudo program command PP_CMD and data to the nonvolatile memory device 120. In response to the pseudo program command PP_CMD, the nonvolatile memory device 120 may generate a program voltage or a verification voltage for a pseudo program operation on a selected memory unit. The nonvolatile memory device 120 may program the selected memory unit in high speed using the voltage generated.

In operation S136, the memory controller 110 may update the mapping table 115 according to the pseudo program operation. A part of page areas of a selected memory unit may be mapped out due to the pseudo program operation. The page area mapped out may be used at a read operation to block a read operation or to invalidate read data.

Figure 8A:
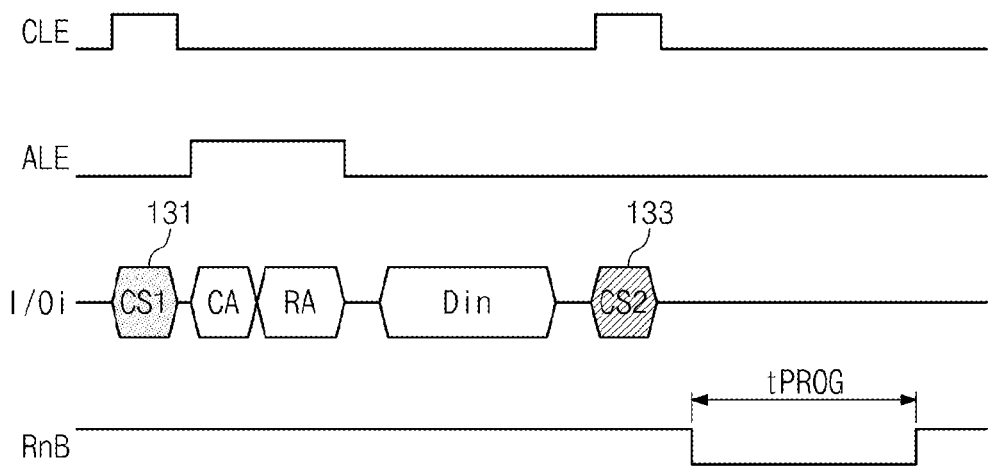
FIGS. 8A and 8B are timing diagrams schematically illustrating an example of a command sequence for a pseudo program operation according to an embodiment of the inventive concept.
Figure 8B:
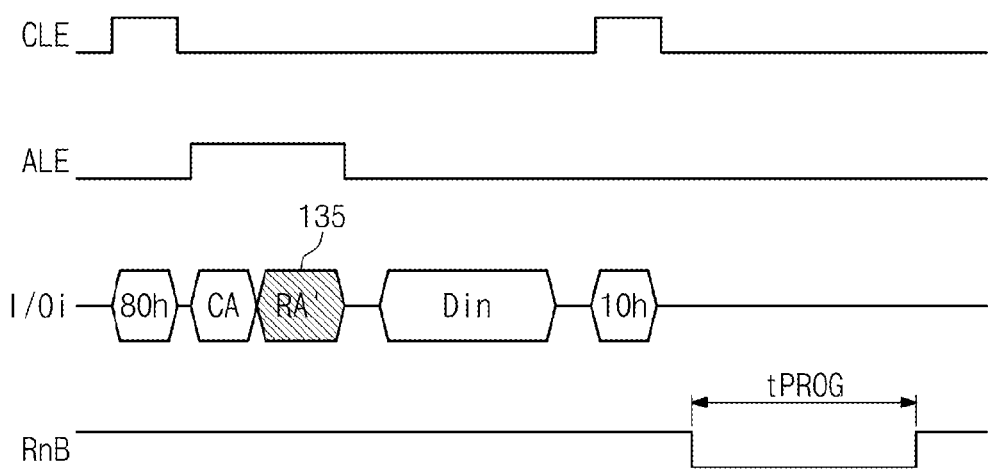

FIGS. 8A and 8B are timing diagrams schematically illustrating an example of a command sequence for a pseudo program operation according to an embodiment of the inventive concept. Referring to FIG. 8A, a new command set may be allocated to a command sequence corresponding to a pseudo program command PP_CMD. During a high-level interval of a command latch enable signal CLE, a nonvolatile memory device 120 (refer to FIG. 3) may receive a first command set 131 directing a pseudo program operation on input data Din. During a high-level interval of an address latch enable signal ALE, the nonvolatile memory device 120 may receive a column address CA and a row address RA for the pseudo program operation. The column and row addresses CA and RA may be provided to the nonvolatile memory device 120 during an address input cycle.

After the addresses are received, write requested data Din may be received. The write data Din may be received in synchronization with a write enable signal /WE (not shown). After the write data Din is received, a second command set 133 directing a program confirm may be received during a high-level interval of the command latch enable signal CLE. In response to the second command set 133, the nonvolatile memory device 120 may program the write data Din at selected memory cells according to a pseudo program mode. A time taken to program data at the selected memory cells through a pseudo program operation may be a program time tPROG corresponding to a low interval of a ready/busy signal RnB. A program time corresponding to a pseudo program mode may be relatively shorter than that corresponding to a normal program mode.

Here, a code corresponding to one of the command sets CS1 and CS2 directing the pseudo program operation or codes corresponding to the command sets CS1 and CS2 may be different from that of a normal program operation.

Referring to FIG. 8B, during a high-level interval of the command latch enable signal CLE, the nonvolatile memory device 120 may receive command sets 80h and 10h. During a high-level interval of the address latch enable signal ALE, the nonvolatile memory device 120 may receive a column address CA and a row address RA' for the pseudo program operation. That is, it is possible to control the nonvolatile memory device 120 through a change of an address set RA' instead of a command set for the pseudo program operation.

FIG. 9 is a table schematically illustrating an example of a mapping table of FIG. 1. Referring to FIG. 9, a memory controller 110 may determined a page address of memory cells selected for a pseudo program operation. For example, in the event that memory cells connected with a word line WL2 are selected for a pseudo program operation, the memory controller 110 may map out an LSB page (1$^{st}$ page) of memory cells connected with the word line WL2. Here, a map-out operation may be an operation for appointing a page area, at which data is not stored, from among page areas allocated to the selected memory cells. For example, in the event that memory cells connected to the word line WL2 are selected for the pseudo program operation, the memory controller 110 may map only an MSB page (e.g., 2$^{nd}$ page) at which data is stored. That is, as illustrated in a table of FIG. 9, a fifth page may be mapped on an MSB page (e.g., 2$^{nd}$ page) of memory cells connected with the word line WL2. Thus, pseudo programmed data may be read out by performing an MSB page (2$^{nd}$ page) read operation on the memory cells connected with the word line WL2.

Figure 10A:
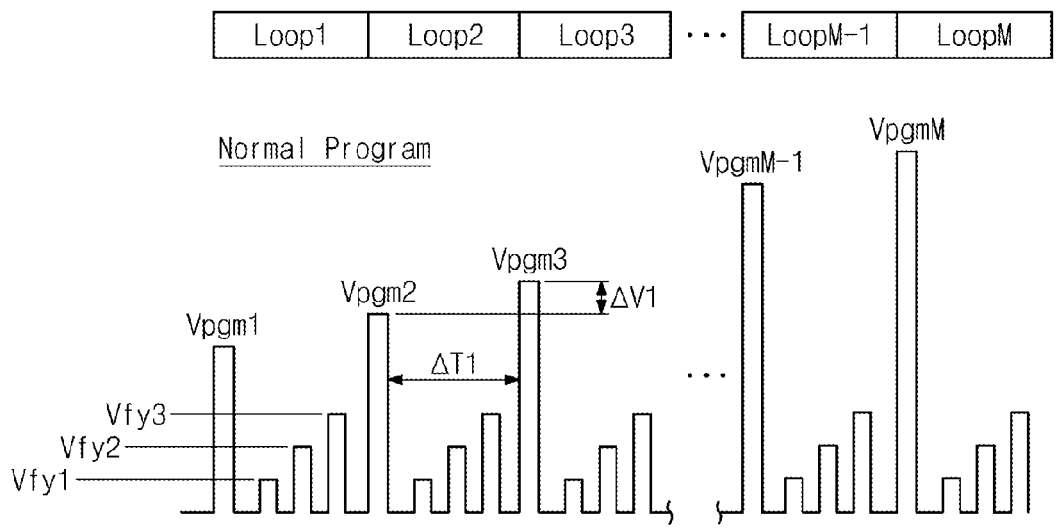
FIGS. 10A, 10B, 10C and 10D are diagrams for reference in describing an example of a pseudo program method according to an embodiment of the inventive concept.
Figure 10B:
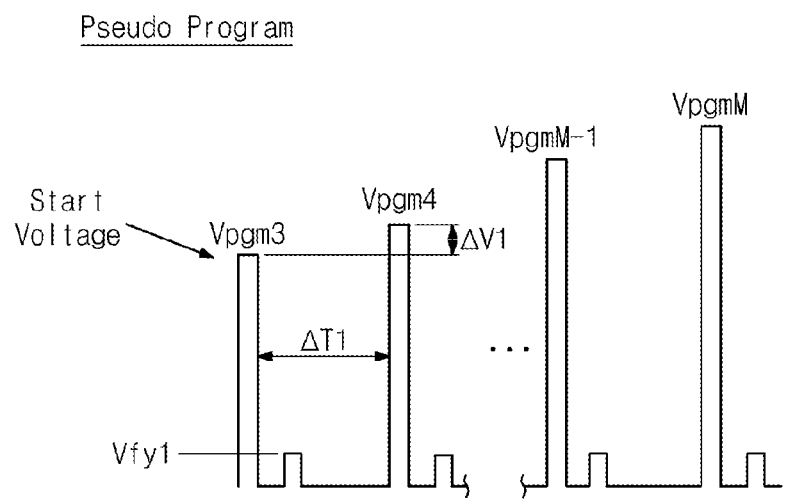
Figure 10C:
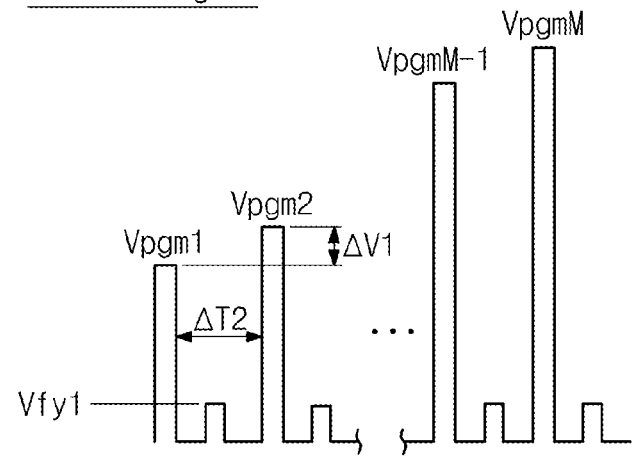
Figure 10D:
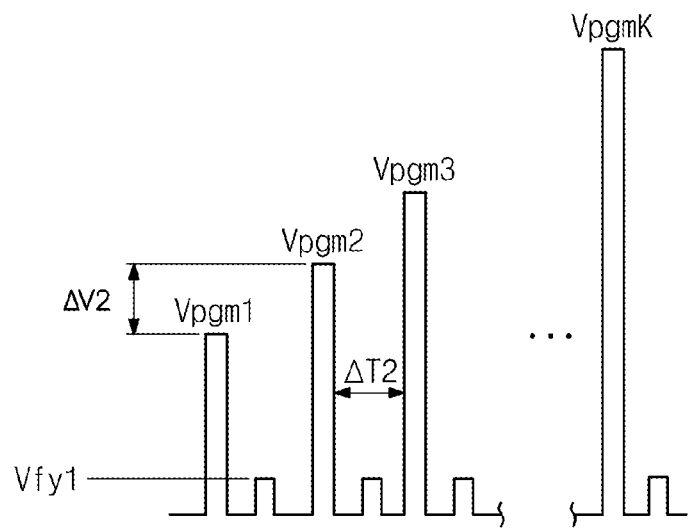

FIGS. 10A to 10D are diagrams for reference in describing an example of a pseudo program method according to an embodiment of the inventive concept. FIG. 10A shows a word line voltage applied to memory cells selected at a normal program operation. FIGS. 10B to 10D show a voltage applied to a word line of memory cells selected at a pseudo program operation. It is assumed that selected memory cells are 2-bit multi-level cells. In this case, threshold voltages of memory cells may be changed to correspond to one of an erase state E0 and three target states Q1 to Q3 at a one-shot program operation.

Referring to FIG. 10A, a program voltage applied to memory cells selected at a normal program operation may be provided as a pulse whose level increases according to an increase in the number of loops. That is, the program voltage may comply with an incremental step pulse programming (ISPP) scheme. With the ISPP scheme, a train of pulses sequentially increasing by an increment $\Delta V1$ may be applied to a word line of selected memory cells. Verification voltages Vfy1, Vfy2, and Vfy3 respectively corresponding to target states Q1, Q2, and Q3 may be applied following each of the program voltage pulses Vpgm1 to VpgmM. The program voltage pulse and the verification voltages may be applied until a maximum loop number (LoopM) is reached.

Referring to FIG. 10B which shows voltages applied to a word line selected at a pseudo program operation of embodiments of the inventive concept, a program voltage pulse VpgmM (M being an integer equal to or more than 3) whose level increases by an increment $\Delta V1$ according to an increase in the number of loops and a verification voltage pulse Vfy1 having a fixed value may be applied to selected memory cells at every loop at the pseudo program operation. A level of the increment V1 of the program voltage Vpgm at the pseudo program operation may be equal to that at the normal program operation described with reference to FIG. 10A, while a start program voltage may be set to a program voltage Vpgm3. Thus, a total program loop number may be reduced. In addition, the verification voltage pulse Vfy1 used to verify a target state P1 may be applied at every program loop. The program voltage pulse and the verification voltage pulse may be applied until a maximum loop number (LoopM) is reached.

Here, the verification voltage Vfy1 may be a voltage used to verify a program state Q1 at the normal program operation. However, the verification voltage Vfy1 may be set to be lower or higher than a verification voltage used to verify a program state Q1 in order to improve program speed.

Referring to FIG. 10O which shows an example where pulse durations of program voltage pulses VpgmN (1≤N≤M) at a pseudo program operation under an assumption that a start program voltage is the same, a target state may exist at the pseudo program operation, so that a time for program verification is shortened. Thus, duration between program voltage pulses may be reduced from $\Delta T1$ to $\Delta T2$ (where $\Delta T1 < \Delta T2$).

Referring to FIG. 10D which shows another example of a word line voltage provided at a pseudo program operation, a level of an increment $\Delta V2$ at the pseudo program operation may be higher than that $\Delta V1$ at the normal program operation. Duration $\Delta T2$ between program voltage pulses VpgmN at the pseudo program operation may be shorter than that $\Delta T1$ at the normal program operation. In this case, program speed may be significantly improved as compared to FIGS. 10A to 10C.

A program voltage and a verification voltage provided at the pseudo program operation are described by way of example with reference to FIGS. 10A to 10D. However, the inventive concept is not limited to these specific example, and various modifications and changes on the word line voltages may be made.

Figure 11:
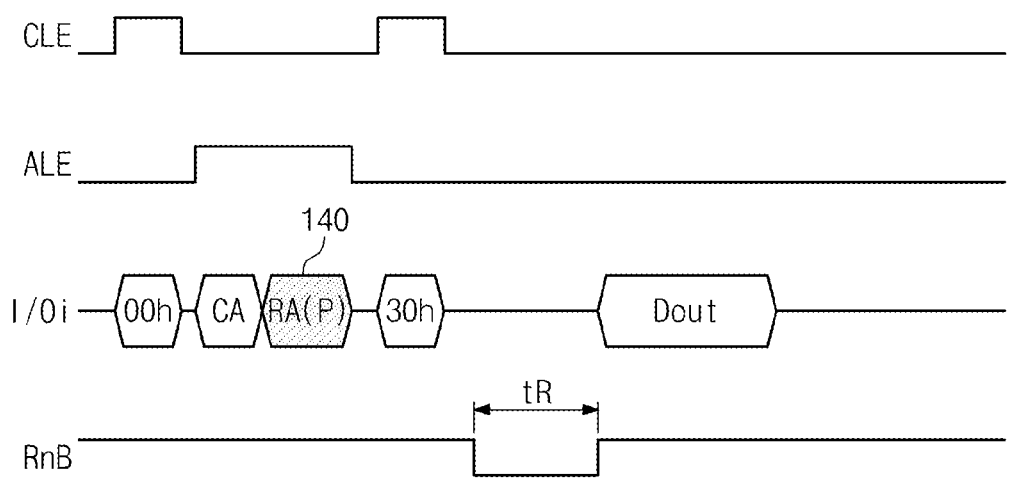
FIG. 11 is a timing diagram for reference in describing an example of a method of reading memory cells programmed through a pseudo program operation.

FIG. 11 is a timing diagram for reference in describing an example of a method of reading memory cells programmed through a pseudo program operation. Referring to FIG. 11, an appointed row address RA(P) may be provided to read memory cells programmed according to a pseudo program command PP_CMD. As described with reference to FIG. 5, in the case of a 2-bit multi-level cell, a memory controller 110 may ignore a mapped-out logical page area referring to a mapping table 115 (refer to FIG. 1). The memory controller 110 may provide a nonvolatile memory device with a read command sequence including the row address RA(P) on data written at memory cells through the pseudo program operation.

During a high-level interval of a command latch enable signal CLE, the memory controller 110 may issue a command set 00h to a nonvolatile memory device 120 (refer to FIG. 1) to read pseudo programmed data. During a high-level interval of an address latch enable signal ALE, the memory controller 110 may provide the nonvolatile memory device 120 with a column address CA and a row address (RA(P)) 140. The row address 140 may be determined based on a page address mapped out as described above. After providing the addresses, the memory controller 110 may issue a command set 30h to the nonvolatile memory device 120 during a high-level interval of the command latch enable signal CLE.

In response to an input of a command, the nonvolatile memory device 120 may sense and latch data during a read time tR. The nonvolatile memory device 120 may perform an MSB page read operation based on the row address (RA(P)) 140. In the event that M-bit multi-level cells (M being an integer of 3 or more) are programmed according to a pseudo program mode, the row address (RA(P)) 140 may be an address corresponding to one or two logical pages of a plurality of logical pages.

If ready to output data, the nonvolatile memory device 120 may set a ready/busy signal RnB to a high level to inform the memory controller 110 that it is ready to output data. The memory controller 110 may fetch data Dout from the nonvolatile memory device 120 with reference to high level of the ready/busy signal RnB.

Figure 12A:
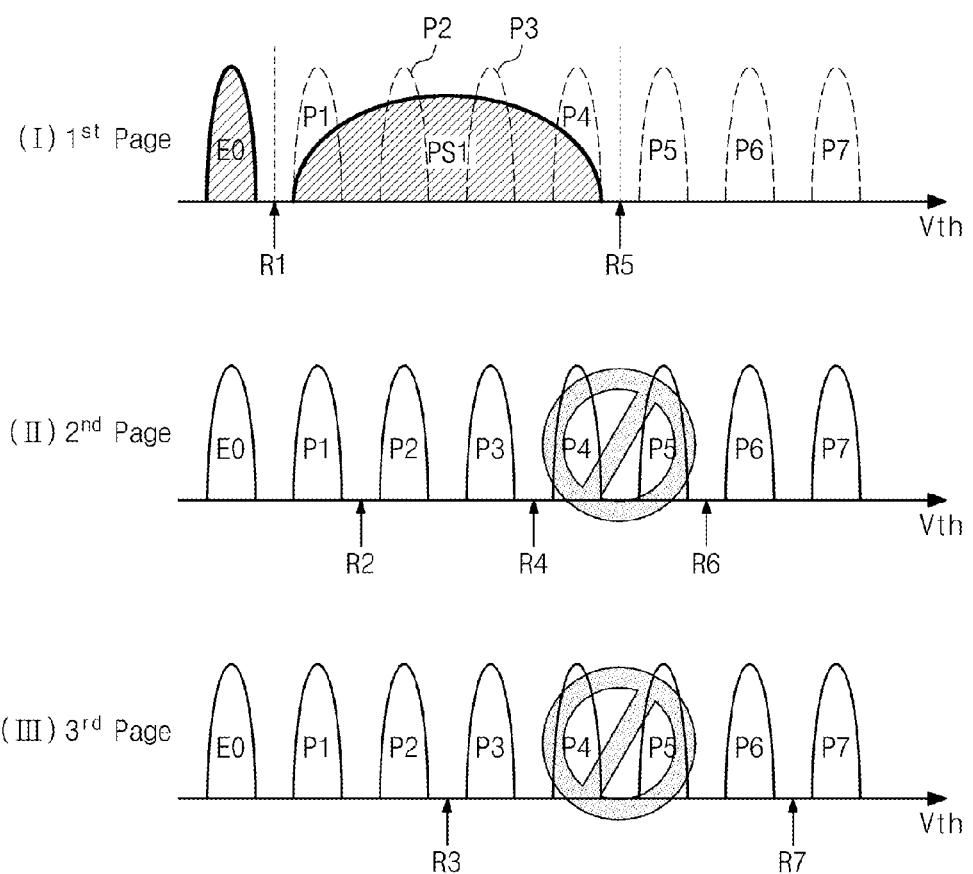

FIGS. 12A and 12B are diagrams for reference in describing an example of a pseudo program method on 3-bit multi-level cells. FIG. 12A shows threshold voltage distributions when 1-bit data is programmed at each of selected memory cells at a pseudo program operation. In particular, a first page area ($1^{st}$ Page) of three logical page areas may be appointed to a memory unit for pseudo programming, and the remaining logical page areas ($2^{nd}$ and $3^{rd}$ Pages) may be mapped out at a mapping table 115 (refer to FIG. 1).

Referring to FIG. 12A, 1-bit data may be programmed at each of selected memory cells at a pseudo program operation. 3-bit data may be stored at selected memory cells through a normal program operation using a one-shot program mode. In the case of the normal program operation, programmed memory cells may have one of an erase state E0 and program states P1 to P7.

If programmed in high speed through a pseudo program operation, selected memory cells may have one of an erase state E0 and a pseudo program state PS1. In FIG. 12A, there is illustrated an example where memory cells are programmed through the high-speed pseudo program operation to have the pseudo program state PS1. However, the inventive concept is not limited thereto. Since the pseudo program state PS1 has a wide voltage window and corresponds to a low threshold voltage, it may be advantageous in terms of program speed.

At a read operation, memory cells programmed according to a pseudo program operation may be read through a first page read operation. For example, pseudo programmed memory cells may be read only through the first page read operation where selected memory cells are read using read voltages R1 and R5. In more detail, whether the selected memory cells have the erase state E0 or the pseudo program state PS1 may be determined using the read voltage R1.

At a read operation, a memory controller 110 may provide an address on a first page area ($1^{st}$ Page) of three logical page areas of selected memory cells. A nonvolatile memory device 120 may sequentially generate the read voltages R1 and R5 for sensing the first page area ($1^{st}$ Page) of the selected memory cells and provide them to a word line connected with the selected memory cells. Whether the selected memory cells are an on-cell or an off-cell may be determined using the read voltages R1 and R5, and a determination result may be stored at a specific latch. Then, the nonvolatile memory device 120 may output data sensed using the read voltage R1 as pseudo programmed data.

Referring to FIG. 12B which shows an example of a mapping table 115 of the memory controller 110 at a pseudo program operation on 3-bit multi-level cells, the memory controller 110 may perform the pseudo program operation on memory cells connected with a word line WL2 and then update the mapping table 115. At this time, the memory controller 110 may map out a second page area ($2^{nd}$ Page) and a third page area ($3^{rd}$ Page) of memory cells connected with the word line WL2. In the event that memory cells connected with the word line WL2 are selected for the pseudo program operation, the memory controller 110 may map the first page area ($1^{st}$ Page) where data is actually stored. That is, the first page area ($1^{st}$ Page) of the memory cells connected with the word line WL2 may be mapped on a seventh page of the nonvolatile memory device 120 corresponding to a logical address input from a host. Thus, pseudo programmed data may be read through a first page read operation on the memory cells connected with the word line WL2.

Figure 13A:
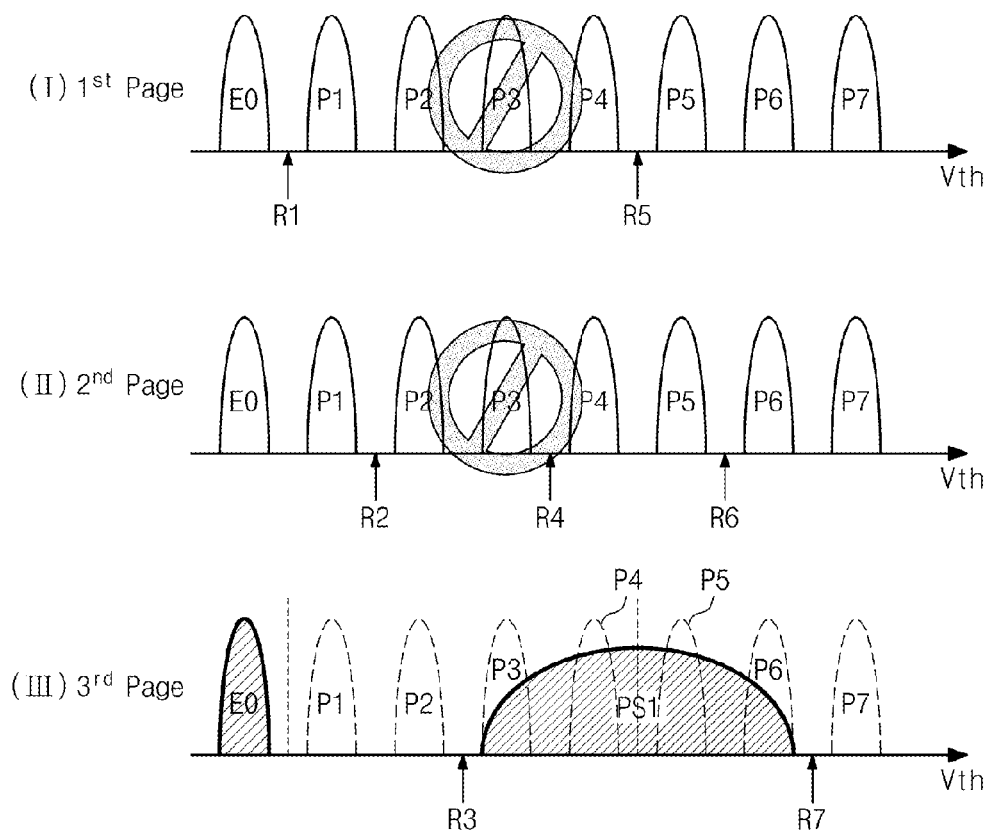

FIGS. 13A and 13B are diagrams for reference in describing another example of a pseudo program method on 3-bit multi-level cells. FIG. 13A shows threshold voltage distributions when 1-bit data is programmed at each of selected memory cells at a pseudo program operation. In particular, a third page area ($3^{rd}$ Page) of three logical page areas may be appointed to a memory unit for pseudo programming, and the remaining logical page areas $1^{st}$ and $2^{nd}$ Pages may be mapped out at a mapping table 115 (refer to FIG. 1).

Referring to FIG. 13A, 1-bit data may be programmed at each of selected memory cells at a pseudo program operation. If programmed in high speed through a pseudo program operation, selected memory cells may have one of an erase state E0 and a pseudo program state PS1. A threshold voltage level of the pseudo program state PS1 in FIG. 13A may be higher than that in FIG. 12A. Thus, a level of a verification voltage used at a pseudo program operation of FIG. 13A may be higher than that used at a pseudo program operation of FIG. 12A. Thus, a program speed may be slower relative to that of a pseudo program operation described previously with reference to FIG. 12A.

At a read operation, memory cells programmed according to a pseudo program operation may be read through a third page read operation. For example, pseudo programmed memory cells may be read only through the third page read operation where selected memory cells are read using read voltages R3 and R7. In more detail, whether the selected memory cells have the erase state E0 or the pseudo program state PS1 may be determined using the read voltage R3.

At a read operation, a memory controller 110 may provide an address on a third page area ($3^{rd}$ Page) of three logical page areas of selected memory cells. A nonvolatile memory device 120 may sequentially generate the read voltages R3 and R7 for sensing the third page area ($3^{rd}$ Page) of the selected memory cells and provide them to a word line connected with the selected memory cells. Whether the selected memory cells are an on-cell or an off-cell may be determined using the read voltages R3 and R7, and a determination result may be stored at a specific latch. Then, the nonvolatile memory device 120 may output data sensed using the read voltage R3 as pseudo programmed data.

Referring to FIG. 13B which shows an example of a mapping table 115 of the memory controller 110 at a pseudo program operation on 3-bit multi-level cells, the memory controller 110 may perform the pseudo program operation on memory cells connected with a word line WL2 and then update the mapping table 115. At this time, the memory controller 110 may map out a first page area ($1^{st}$ Page) and a second page area ($2^{nd}$ Page) of memory cells connected with the word line WL2. In the event that memory cells connected with the word line WL2 are selected for the pseudo program operation, the memory controller 110 may map the third page area ($3^{rd}$ Page) where data is actually stored. That is, the third page area ($3^{rd}$ Page) of the memory cells connected with the word line WL2 may be mapped on a seventh page of the nonvolatile memory device 120 corresponding to a logical address input from a host. Thus, pseudo programmed data may be read through a third page read operation on the memory cells connected with the word line WL2.

Figure 14A:
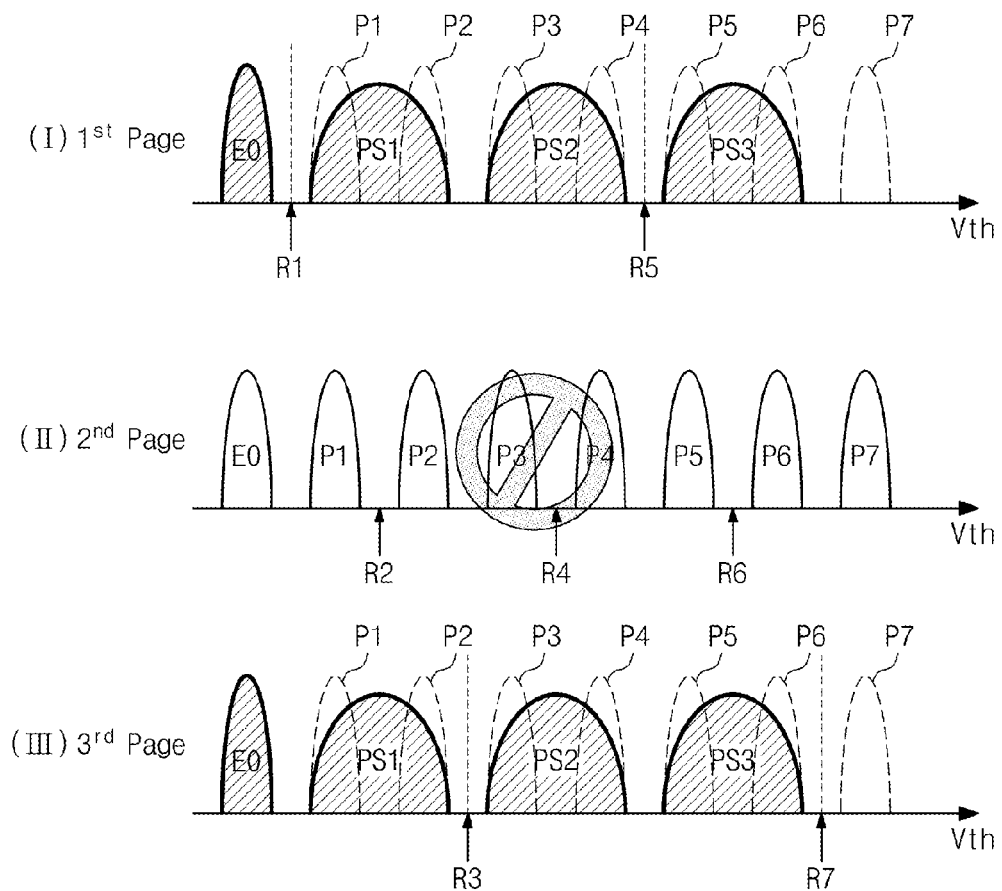
FIGS. 14A and 14B are diagrams for reference in describing still another example of a pseudo program method on 3-bit multi-level cells.
Figure 14B:
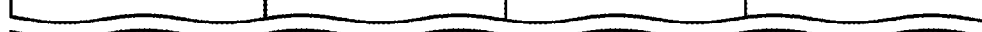

FIGS. 14A and 14B are diagrams for reference in describing still another example of a pseudo program method on 3-bit multi-level cells. FIG. 14A shows threshold voltage distributions when 2-bit data is programmed at each of selected memory cells at a pseudo program operation. In particular, a first page area ($1^{st}$ Page) and a third page area ($3^{rd}$ Page) of three logical page areas may be appointed to memory units for pseudo programming, and a second page area ($2^{nd}$ Page) may be mapped out at a mapping table 115 (refer to FIG. 1).

Referring to FIG. 14A, 2-bit data may be programmed at each of selected memory cells at a pseudo program operation. 3-bit data may be stored at selected memory cells through a normal program operation using a one-shot program mode. However, in the case of the pseudo program operation, memory cells may be programmed to have an erase state E0 or one of a plurality of pseudo program states PS1 to PS3. That is, first and third page areas $1^{st}$ and $3^{rd}$ Pages of selected memory cells may be selected for the pseudo program operation.

At a read operation, memory cells programmed according to a pseudo program operation may be read through a first page read operation or a third page read operation. For example, the memory controller 110 may provide a read command illustrated in FIG. 11 to read pseudo programmed data of the first page area. At this time, the memory controller 110 may provide a row address corresponding to the first and third page areas ($1^{st}$ and $3^{rd}$ Pages). The nonvolatile memory device 120 may read selected memory cells using read voltages R1, R3, R5, and R7. The nonvolatile memory device 120 may output two pages of data sensed through the read operation.

Alternatively, the memory controller 110 may output a row address corresponding to the first page area ($1^{st}$ Page) of the selected memory cells. In this case, the nonvolatile memory device 120 may read the selected memory cells using the read voltages R1, R3, R5, and R7, and may output data, corresponding to the first page area ($1^{st}$ Page), from among the data read using the read voltages R1, R3, R5, and R7. At a third page read operation, selected memory cells may be sensed in the same mode as that at the first page read operation. In this case, there may be output data, corresponding to a third page area ($3^{rd}$ Page) read requested, from among two pages of data latched.

Referring to FIG. 14B which shows an example of a mapping table 115 of the memory controller 110 at a pseudo program operation on 3-bit multi-level cells, the memory controller 110 may perform the pseudo program operation on memory cells connected with a word line WL2 and then update the mapping table 115. At this time, the memory controller 110 may map out a second page area ($2^{nd}$ Page) of memory cells connected with the word line WL2. In the event that memory cells connected with the word line WL2 are selected for the pseudo program operation, the memory controller 110 may map the first and third page areas ($1^{st}$ and $3^{rd}$ Pages) where data is actually stored. That is, the first and third page areas $1^{st}$ and $3^{rd}$ Pages of the memory cells connected with the word line WL2 may be mapped on a physical address of the nonvolatile memory device 120 corresponding to a logical address input from a host. Thus, pseudo programmed data may be read through reading on two page areas (e.g., $1^{st}$ and $3^{rd}$ pages) of the memory cells connected with the word line WL2.

Figure 15A:
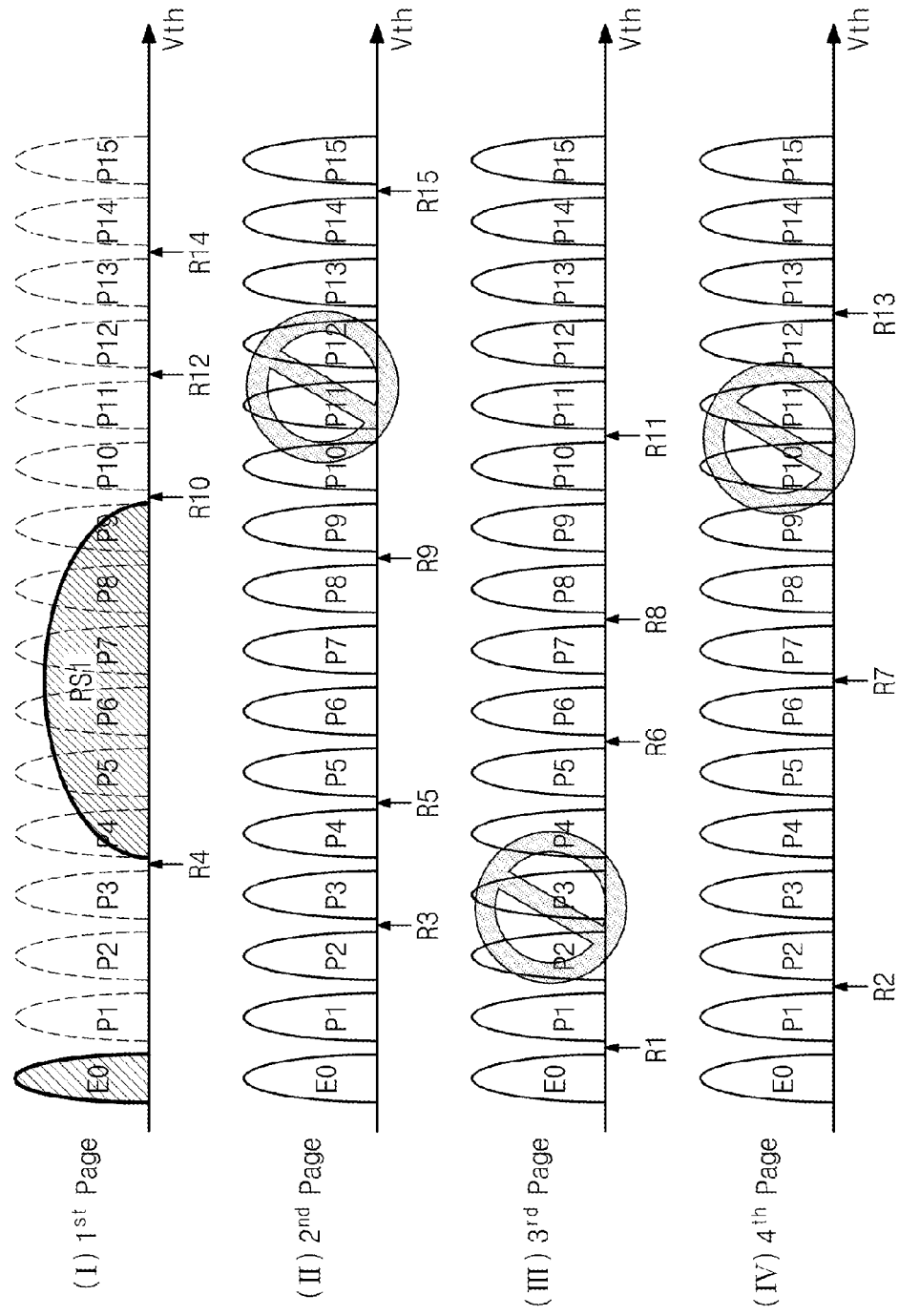

FIGS. 15A and 15B are diagrams for reference in describing an example of a pseudo program method on 4-bit multi-level cells. FIG. 15A shows threshold voltage distributions when 1-bit data is programmed at each of selected memory cells at a pseudo program operation. In particular, a first page area ($1^{st}$ Page) of four logical page areas may be appointed to a memory unit for pseudo programming, and the remaining logical page areas ($2^{nd}$ to $4^{th}$ Pages) may be mapped out at a mapping table 115 (refer to FIG. 1).

Referring to FIG. 15A, 1-bit data may be programmed at each of selected memory cells at a pseudo program operation. 4-bit data may be stored at selected memory cells through a normal program operation using a one-shot program mode. In the case of the normal program operation, the programmed memory cells may have one of an erase state E0 and program states P1 to P15.

At a read operation, four read voltages R4, R10, R12, and R14 may be used to read a first page area ($1^{st}$ Page), and four read voltages R3, R5, R9, and R15 may be used to read a second page area ($2^{nd}$ Page). A third page area ($3^{rd}$ Page) may be read using four read voltages R1, R6, R8, and R11, and a fourth page area ($4^{th}$ Page) may be read using three read voltages R2, R7, and R13. At a read operation, such read voltages may be sequentially applied to selected memory cells, and read data corresponding to each page may be stored at an appointed latch.

In the event that logical $2^{nd}$, $3^{rd}$ and $4^{th}$ Pages are excluded by a pseudo program operation, however, fourth read voltages R4, R10, R12, and R14 may be used to read the first page area ($1^{st}$ Page). Pseudo programmed data may be read through a first page read operation where selected memory cells are read using the read voltages R4, R10, R12, and R14. In more detail, whether the selected memory cells have the erase state E0 or a pseudo program state PS1 may be determined using the read voltage R4.

At a read operation, a memory controller 110 may provide an address, corresponding to a first page area ($1^{st}$ Page), from among four logical page areas of selected memory cells. A nonvolatile memory device 120 may sequentially generate the read voltages R4, R10, R12, and R14 for sensing the first page area ($1^{st}$ Page) of the selected memory cells and provide them to a word line connected with the selected memory cells. Whether the selected memory cells are an on-cell or an off-cell may be determined using the read voltages R4, R10, R12, and R14, and a determination result may be stored at a specific latch. Then, the nonvolatile memory device 120 may output data sensed using the read voltage R4 as pseudo programmed data.

Referring to FIG. 15B which shows a mapping table 115 of the memory controller 110 at a pseudo program operation on 4-bit multi-level cells, the memory controller 110 may perform the pseudo program operation on memory cells connected with a word line WL2 and then update the mapping table 115. At this time, the memory controller 110 may map out second, third and fourth page areas ($2^{nd}$, $3^{rd}$ and $4^{th}$ Pages) of memory cells connected with the word line WL2. In the event that memory cells connected with the word line WL2 are selected for the pseudo program operation, the memory controller 110 may map the first page area ($1^{st}$ Page) where data is actually stored. That is, the first page area ($1^{st}$ Page) of the memory cells connected with the word line WL2 may be mapped on a ninth page of the nonvolatile memory device 120 corresponding to a logical address input from a host. Thus, pseudo programmed data may be read through a first page read operation on the memory cells connected with the word line WL2.

Figure 16A:
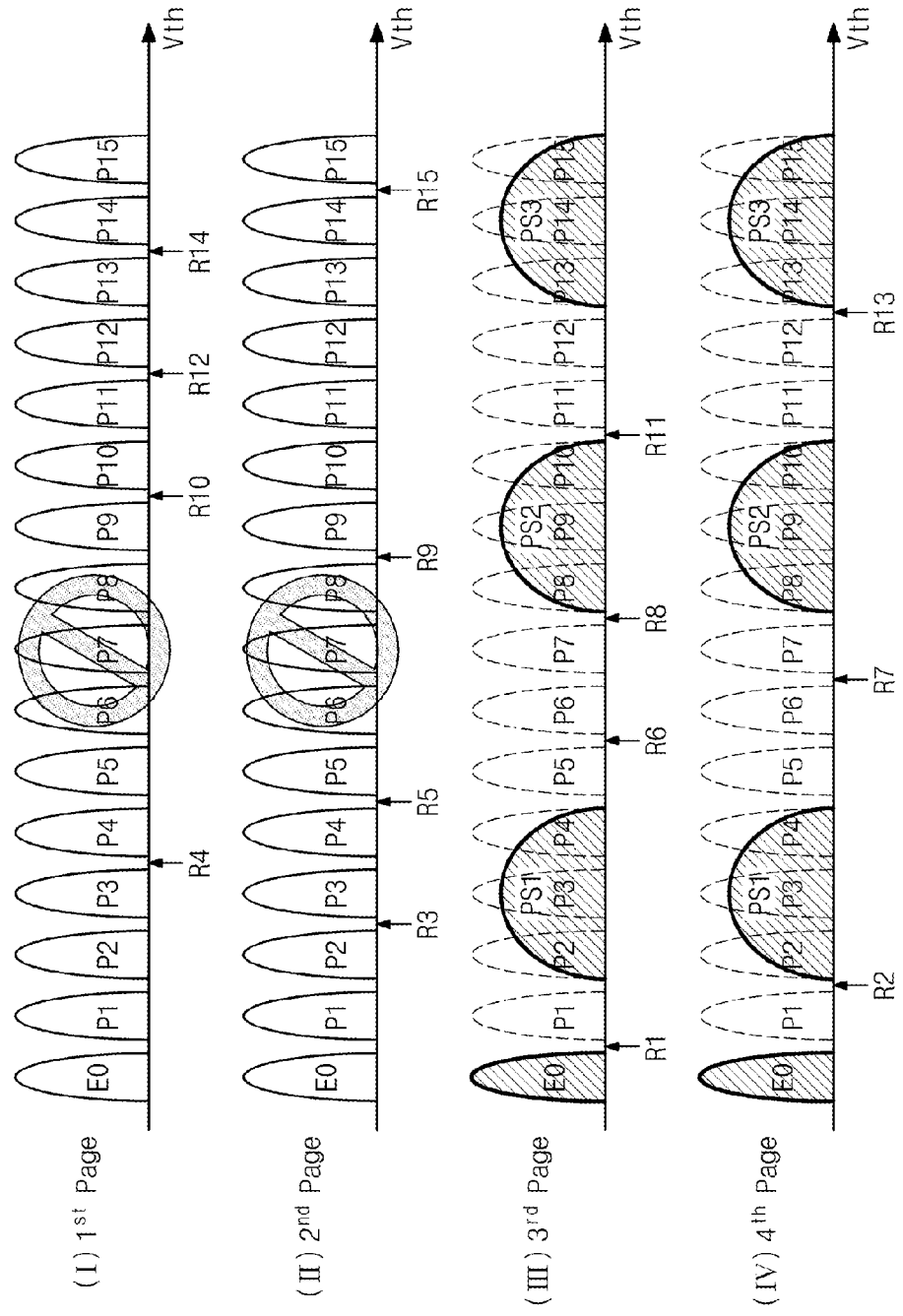

FIGS. 16A and 16B are diagrams for reference in describing another example of a pseudo program method on 4-bit multi-level cells. FIG. 16A shows threshold voltage distributions when 2-bit data is programmed at each of selected memory cells at a pseudo program operation. In particular, third and fourth page areas ($3^{rd}$ and $4^{th}$ Pages) of four logical page areas may be appointed to memory units for pseudo programming, and the remaining logical page areas ($1^{st}$ and $2^{nd}$ Pages) may be mapped out at a mapping table 115 (refer to FIG. 1).

Referring to FIG. 16A, 1-bit data may be programmed at each of selected memory cells at a pseudo program operation. 4-bit data may be stored at selected memory cells through a normal program operation using a one-shot program mode. However, memory cells may be programmed to have an erase state E0 or one of a plurality of pseudo program states PS1 to PS3 through the pseudo program operation. That is, third and fourth page areas ($3^{rd}$ and $4^{th}$ Pages) of selected memory cells may be selected for the pseudo program operation.

At a read operation, memory cells programmed according to a pseudo program operation may be read through a third page read operation or a fourth page read operation. For example, the memory controller 110 may provide a read command illustrated in FIG. 11 to read pseudo programmed data of the third page area. At this time, the memory controller 110 may provide a row address corresponding to the third page area ($3^{rd}$ Page). The nonvolatile memory device 120 may read selected memory cells using read voltage sets (R1, R6, R8, R11) and (R2, R7, R13). The nonvolatile memory device 120 may output data, corresponding to the third page area, from among two pages of data sensed through the read operation.

At a fourth page read operation, selected memory cells may be sensed in the same mode as that at the third page read operation. In this case, there may be output data, corresponding to a fourth page area $4^{th}$ Page read requested, from among two pages of data latched.

Referring to FIG. 16B which shows an example of a mapping table 115 of the memory controller 110 at a pseudo program operation on 4-bit multi-level cells, the memory controller 110 may perform the pseudo program operation on memory cells connected with a word line WL2 and then update the mapping table 115. At this time, the memory controller 110 may map out first and second page areas ($1^{st}$ and $2^{nd}$ Pages) of memory cells connected with the word line WL2. In the event that memory cells connected with the word line WL2 are selected for the pseudo program operation, the memory controller 110 may map the third and fourth page areas ($3^{rd}$ and $4^{th}$ Pages) where data is actually stored. That is, the third and fourth page areas ($3^{rd}$ and $4^{th}$ Pages) of the memory cells connected with the word line WL2 may be mapped on a physical address of the nonvolatile memory device 120 corresponding to a logical address input from a host. Thus, pseudo programmed data may be read through reading on two page areas (e.g., $3^{rd}$ and $4^{th}$ pages) of the memory cells connected with the word line WL2.

Various pseudo program methods are described with reference to accompanying drawings. In 3-bit MLC and 4-bit MLC, at least one or more page areas may be allocated for a pseudo program operation. However, the inventive concept is not limited thereto. Although not described above, a mode of allocating logical page areas is applicable to the pseudo program operation. In this case, the number of pages to be allocated to memory cells selected at a pseudo program operation may be less by one than that corresponding to a maximum storage capacity.

Figure 17:
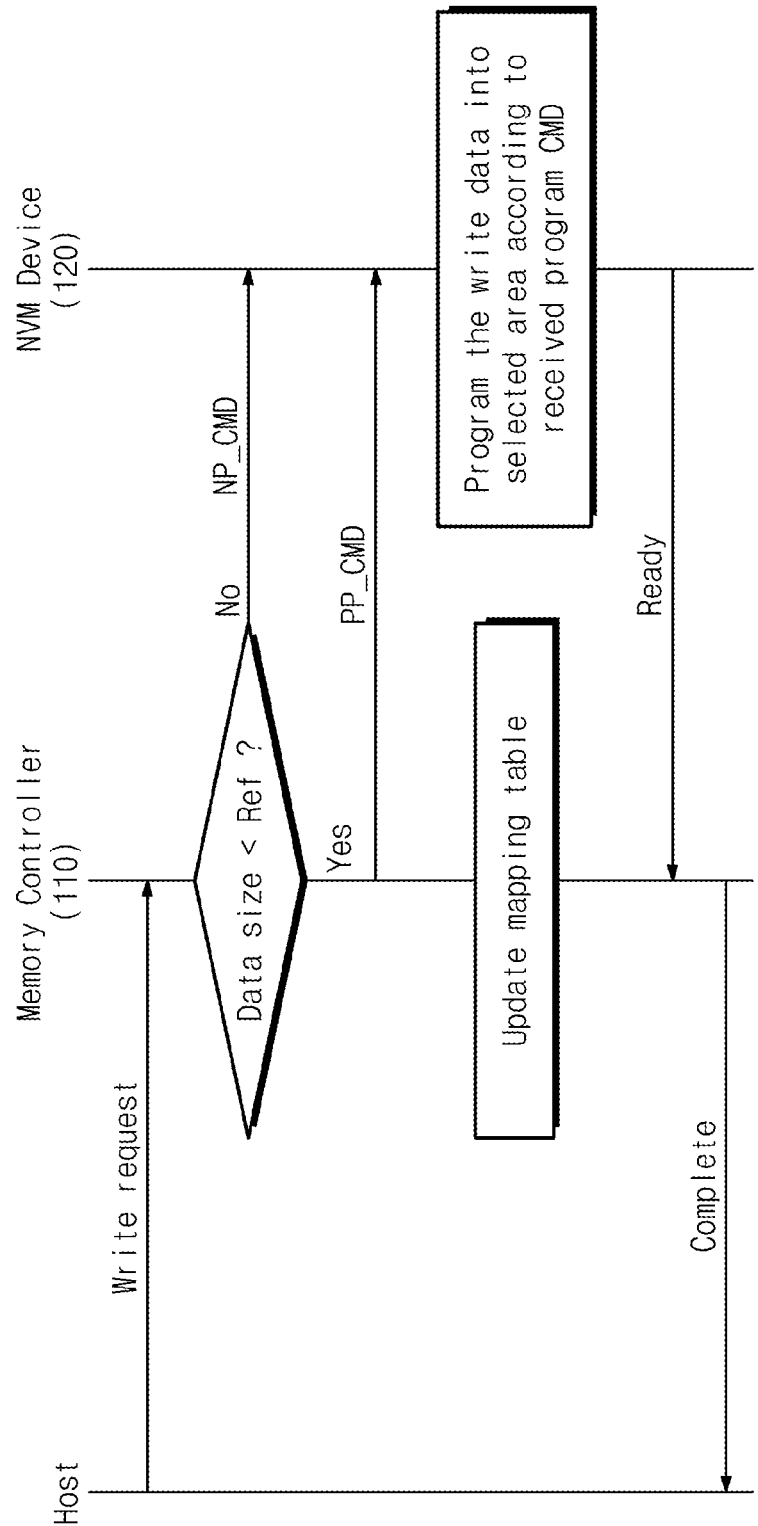
FIG. 17 is a diagram for reference in describing an example of an operation of a memory system according to an embodiment of the inventive concept.

FIG. 17 is a diagram for reference in describing an operation of a memory system according to an embodiment of the inventive concept.

A host may transfer a write request to a memory controller 110. In response to the write request, the memory controller 110 may compare a size of write data with a reference size. If the size of write data is equal to or larger than the reference size, the memory controller 110 may issue a normal program command NP_CMD to a nonvolatile memory device 120. If the size of write data is smaller than the reference size, the memory controller 110 may issue a pseudo program command PP_CMD to the nonvolatile memory device 120 such that data is programmed according to a pseudo program operation.

After providing the program command, the memory controller 110 may update a mapping table 115. In case of the normal program operation, all pages of selected memory cells may be valid. On the other hand, in case of the pseudo program operation, a part of pages of selected memory cells may be mapped out at the mapping table 115.

In response to one of the normal and pseudo program commands NP_CMD and PP_CMD, the nonvolatile memory device 120 may program selected memory cells. For example, in response to the normal program command, the nonvolatile memory device 120 may program all pages allocated to the selected memory cells according to a one-shot program mode. On the other hand, in response to the pseudo program command, the nonvolatile memory device 120 may program a part (e.g., an MSB page) of pages allocated to the selected memory cells. If programming of write data is completed, the nonvolatile memory device 120 may provide the memory controller 110 with a ready signal indicating that the nonvolatile memory device 120 is accessible.

In response to the ready signal from the nonvolatile memory device 120, the memory controller 110 may send a complete signal indicating completion of the write request to the host.

Figure 18:
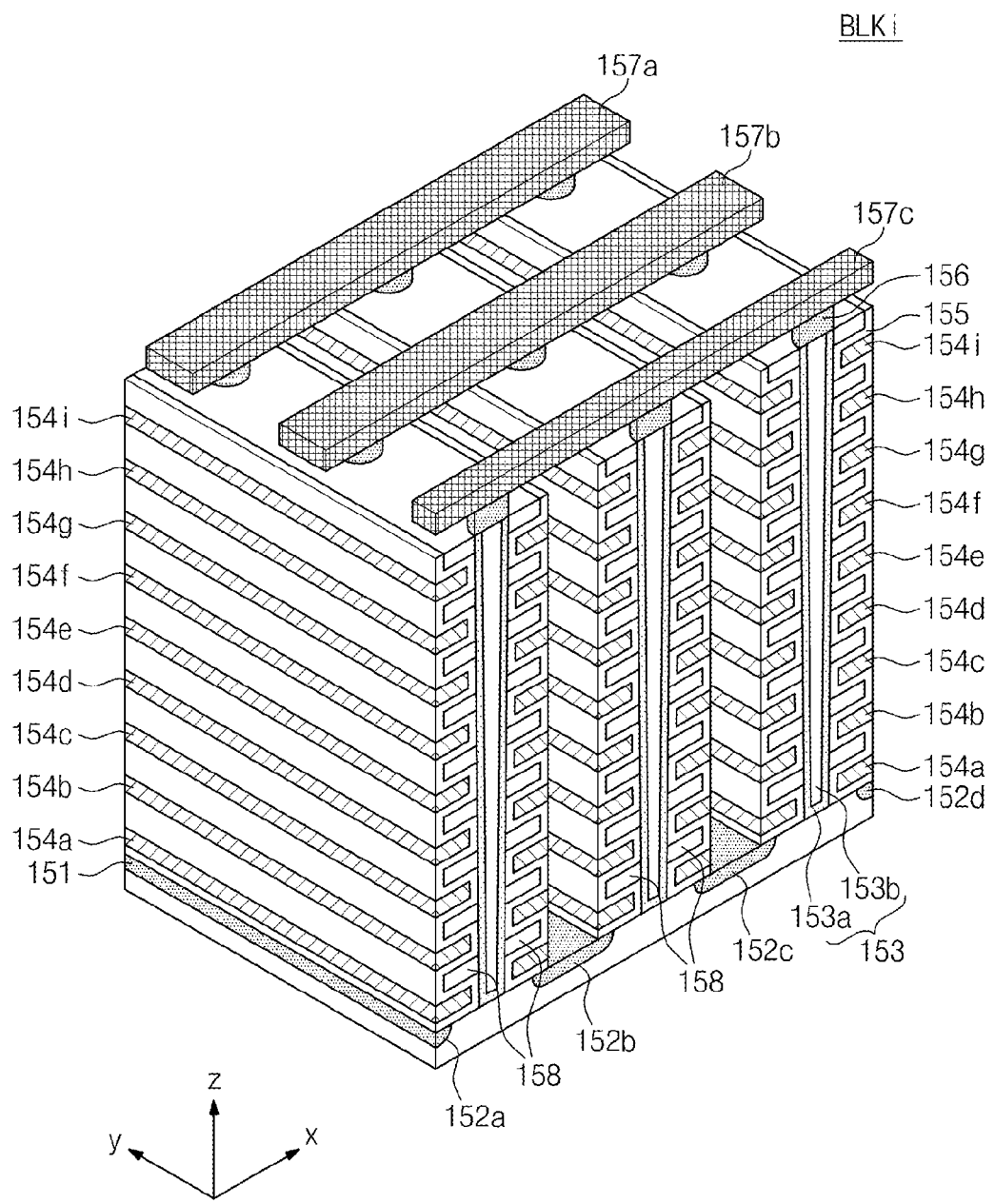
FIG. 18 is a perspective view of an example of a memory block of a nonvolatile memory device of FIG. 1.

FIG. 18 is a perspective view of an example of a memory block BLKi of a nonvolatile memory device of FIG. 1. Referring to FIG. 18, a memory block BLKi may include structures extending along a plurality of axial directions x, y, and z.

A substrate 151 may be provided to form the memory block BLK. A plurality of doping regions 152a, 152b, 152c, and 152d may be formed at a substrate 151 along the x-direction. A plurality of insulation materials 158 extending along the y-direction may be sequentially provided along the z-direction and formed on the substrate between the first and second doping regions 152a and 152b. The insulation materials 158 may be formed to be spaced apart from one another along the z-direction.

On the substrate 151 between the first and second doping regions 152a and 152b, pillars 153 may be sequentially disposed along the y-direction and formed to penetrate the insulation materials 158 along the z-direction. In example embodiments, the pillars 153 may be connected with the substrate 151 through the insulation materials 158. Here, the pillars 153 may be formed on the substrate 151 between the second and third doping regions 152b and 152c and on the substrate 151 between the third and fourth doping regions 152c and 152d.

An inner layer 153b of the pillar 153 may be formed of an insulation material. For example, the inner layer 153b of the pillar 153 may include an insulation material such as silicon oxide. An insulation film 155 may be provided between the first and second doping regions 152a and 152b along exposed surfaces of the insulation materials 158, the pillars 153, and the substrate 151. Some example embodiments encompass removal of the insulation film 155 provided on an exposed surface (e.g., exposed in the z-direction) of the last insulation material 18 provided along the z-direction.

First conductive materials 154a to 154i may be provided on the exposed surface of the insulation film 155 between the first and second doping regions 152a and 152b, respectively. For example, a first conductive material 154a extending along the y-direction may be provided between the substrate 151 and an insulation film 158 adjacent to the substrate 151. In more detail, the first conductive material 154a extending along the x-direction may be provided between the substrate 151 and an insulation film 155 on a lower surface of the insulation material 158 adjacent to the substrate 151. The same structure as that between the first and second doping regions 152a and 152b may be provided between the second and third doping regions 152b and 152c. Likewise, the same structure as that between the first and second doping regions 152a and 152b may be provided between the third and fourth doping regions 152c and 152d.

Drains 156 may be provided on the pillars 153. The drains 156 may be formed of an n-type silicon material. Second conductive materials 157a to 157c extending along the x-direction may be provided on the drains 156. The second conductive materials 157a to 157c may be sequentially disposed along the y-direction. The second conductive materials 157a to 157c may be connected with the drains 156 at corresponding areas. For example, the drains 156 and the second conductive material 157c extending along the x-direction may be interconnected through contact plugs.

Here, the first conductive materials 154a to 154i may form word lines and selection lines. The first conductive materials 154b to 154h used as word lines may be formed such that conductive materials belonging to the same layer are interconnected. The memory block BLKi may be selected by selecting all of the first conductive materials 154a to 154i. It will be understood that the number of first conductive materials 154a to 154i illustrated in FIG. 18 is exemplary, and that the inventive concept is not limited thereto. Likewise, the number of first conductive materials 154a to 154i may be changed according to a process technique or a control technique or other design considerations.

The above-described memory block BLKi may have a three-dimensional structure. The three-dimensional nonvolatile memory device may include charge trap flash (CTF) memory cells. In the CTF flash memory structure, a charge storage layer may be formed of a nonconductive material, so that coupling between word lines is reduced. It is possible to apply a one-shot program scheme to the CTF flash memory device, and the reliability of data may be improved through a pseudo program mode of the inventive concept.

Figure 19:
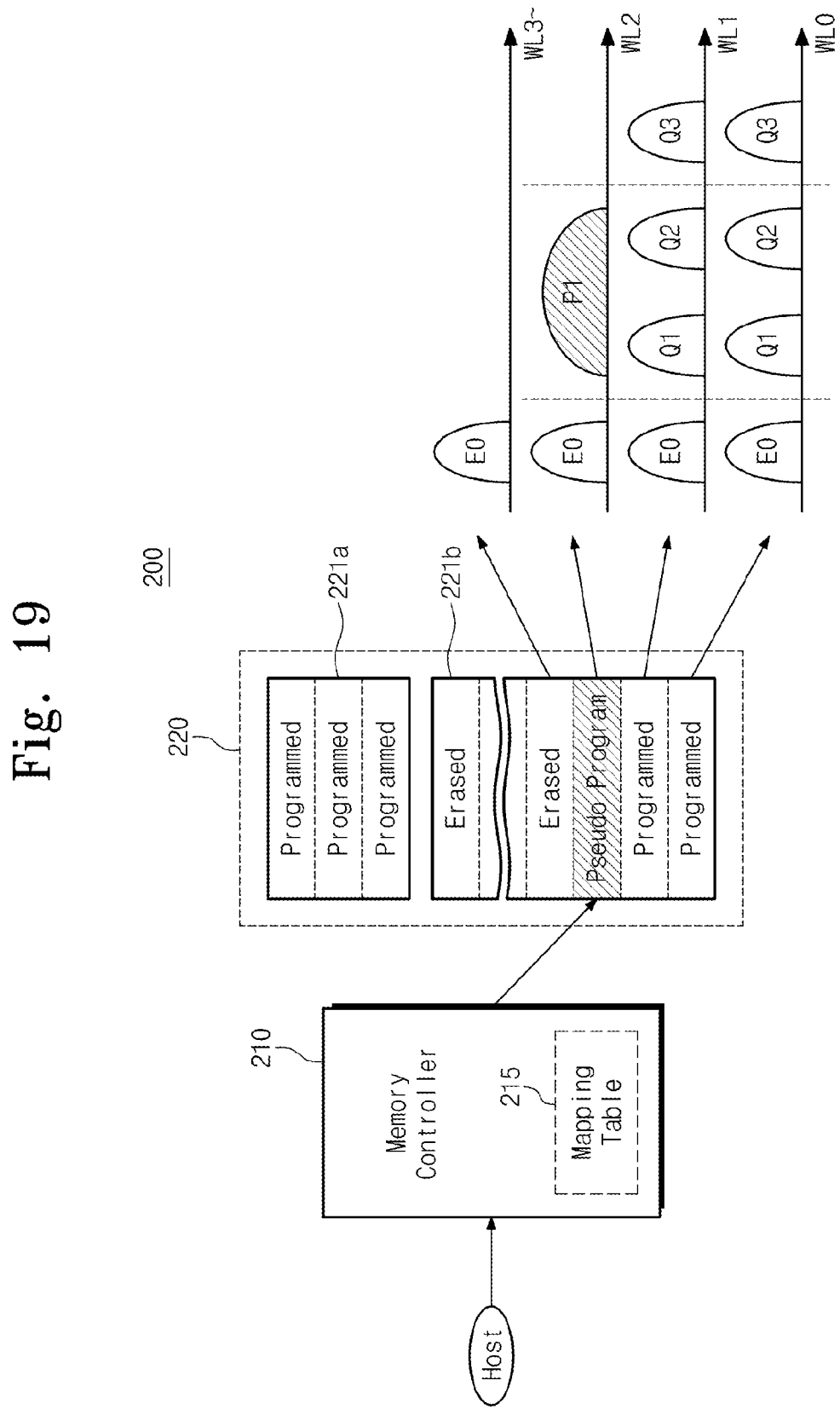
FIG. 19 is a diagram for reference in describing an example of a memory system according to another embodiment of the inventive concept.

FIG. 19 is a block diagram schematically illustrating a memory system according to another embodiment of the inventive concept. Referring to FIG. 19, a memory system 200 of this embodiment may include a memory controller 210 and a nonvolatile memory device 220.

The memory controller 210 may be configured to control the nonvolatile memory device 220 in response to a request of a host. In response to a write request of the host, the memory controller 210 may provide a write command and an address to the nonvolatile memory device 220. The memory controller 210 may control a program operation of the nonvolatile memory device 220 in an on-chip-buffered program (OBP) mode. For example, if data corresponding to a minimum program unit (e.g., a page of data) of a buffer region 221a of the nonvolatile memory device 220 is received, the memory controller 210 may control the nonvolatile memory device 220 such that data corresponding to the minimum program unit is stored at the buffer region 221a. This operation may be referred to as a buffer program operation.

The buffer program operation may be executed according to address information. If data corresponding to a minimum program unit of a main region 221b of the nonvolatile memory device 220 is stored at the buffer region 221a, the memory controller 210 may control the nonvolatile memory device 220 such that data corresponding to the minimum program unit of the main region 221b is stored at the main region 221b. This operation may be referred to as a main program operation.

The memory controller 210 may control programming of write requested data into the main region 221b according to a program or erase state of the buffer or main region 221a or 221b. For example, if a write request is received, the memory controller 210 may check a state of the buffer region 221a based on a mapping table 215. For example, in the event that the buffer region 221a is at an erase state or has sufficient space to store write requested data, the memory controller 210 may perform the buffer program operation. In the event that an overall space of the buffer region 221a is programmed, the memory controller 210 may skip the buffer program operation. In this case, the memory controller may control the nonvolatile memory device 220 such that write requested data is written at a specific space of the main region 221b through a pseudo program operation.

In FIG. 19, there is illustrated an example where memory cells connected with a word line WL2 of the main region 221b are selected for the pseudo program operation. The pseudo program operation may enable the write requested data to be programmed at selected memory cells in high speed. After providing the write requested data and a pseudo program command PP_CMD to the nonvolatile memory device 220, the memory controller 210 may update the mapping table 215. For example, the memory controller 210 may update the mapping table 215 such that there is mapped out an address, corresponding to an LSB page, from among page addresses of memory cells connected with a word line WL2.

In a memory system adopting the OBP mode, if a pseudo program method of the inventive concept is used in which the buffer region 221a is not erased before pseudo programming, the performance may be significantly improved as compared to the case where the buffer region 221a is erased and then data is programmed.

The nonvolatile memory device 220 may be formed of one or more memory devices. The memory controller 210 and the nonvolatile memory device 220 may form a memory card, a solid state drive (SSD), a memory stick, and so on. The nonvolatile memory device 220 may include a plurality of memory blocks, each of which has memory cells arranged in rows and columns. Each memory cell may store multi-bit or multi-level data. The memory cells may be arranged to have a two-dimensional array structure or a three-dimensional array structure.

Figure 20:
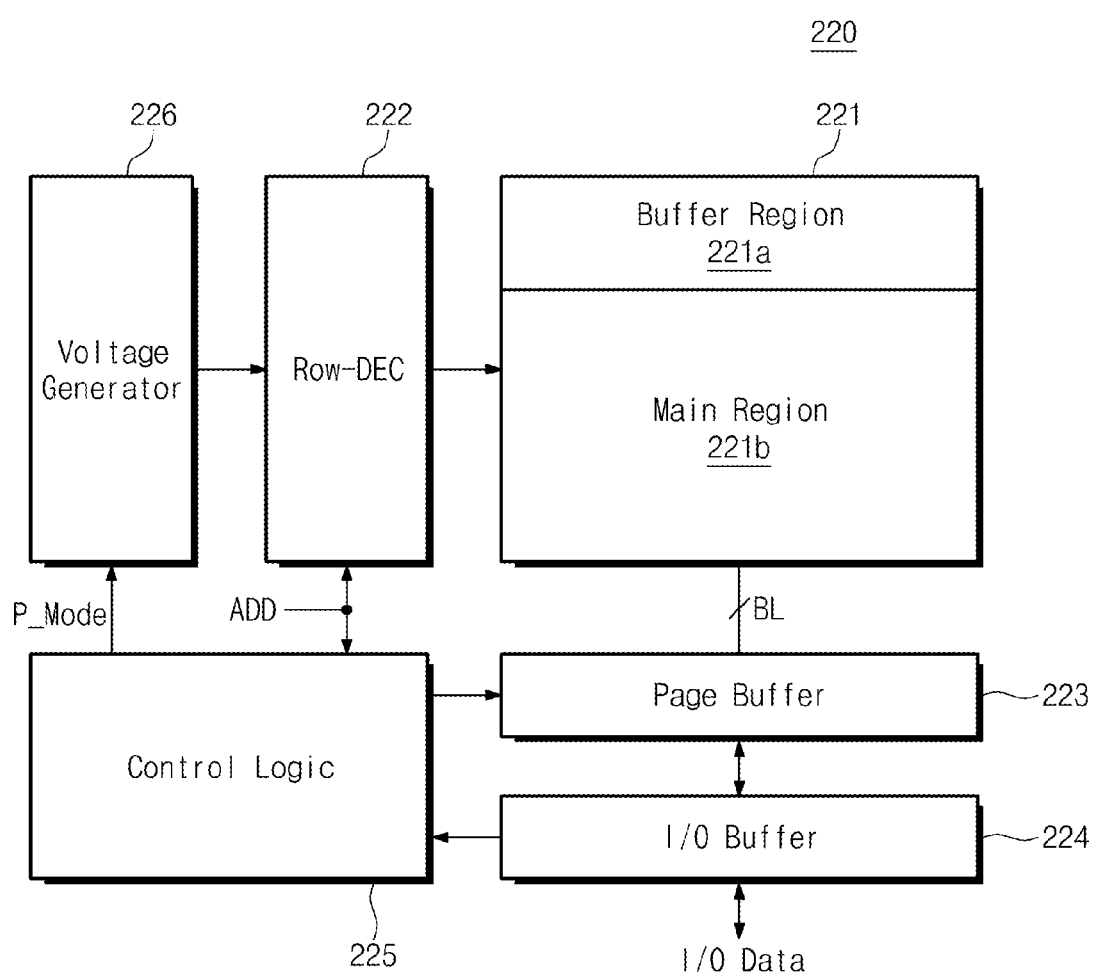
FIG. 20 is a block diagram schematically illustrating an example of a nonvolatile memory device of FIG. 19.

FIG. 20 is a block diagram schematically illustrating an example of nonvolatile memory device of FIG. 19. Referring to FIG. 20, a cell array 221 of a nonvolatile memory device 220 of this example may include a buffer region 221a and a main region 221b.

The cell array 221 may be connected to a row decoder 222 through word lines and selection lines. The cell array 221 may be connected to a page buffer 223 through bit lines. The cell array 221 may include a plurality of NAND cell strings. In particular, the cell array 221 may be divided into a buffer region 221a and a main region 221b. Data may be first programmed at the buffer region 221a, and data stored at the buffer region 221a may be then programmed at the main region 221b.

A main program operation may be executed according to address information associated with data stored at the buffer region 221a. For example, a minimum program unit of the buffer region 221a and a minimum program unit of the main region 221b may be variously determined according to a program mode, the number of data bits stored at a memory cell, and so on. The minimum program unit of the buffer region 221a may be different from the minimum program unit of the main region 221b.

In example embodiments, the memory regions 221a and 221b may be divided logically, not physically. That is, it is possible to change the memory regions 221a and 221b logically. A mode of programming memory blocks of the buffer region 221a may be different from a mode of programming memory blocks of the main region 221b. For example, memory blocks of the buffer region 221a may be programmed according to a single level cell (SLC) program mode (hereinafter, referred to as SLC program mode). On the other hand, memory blocks of the buffer region 221a may be programmed according to a multi-level cell (MLC) program mode (hereinafter, referred to as MLC program mode).

In other example embodiments, memory blocks of the buffer region 221a and memory blocks of the main region 221b may be programmed according to the MLC program mode. For example, each memory cell of the buffer region 221a may store 2-bit data, and each memory cell of the main region 221b may store N-bit data (N being an integer of 3 or more). Alternatively, the number of bits stored at each memory cell of the buffer region 221a may be less than that (e.g., N-bit data (N being an integer of 3 or more)) of the main region 221b.

The row decoder 222, the page buffer 223, an input/output buffer 224, control logic 225, and a voltage generator 226 may operate in substantially the same manner as that described previously with reference to FIG. 3, and a description thereof is thus omitted to avoid redundancy. That is, if a pseudo program command PP_CMD is provided from an external device, the control logic 225 may provide the voltage generator 226 with a program mode P_Mode for controlling generation of a program voltage. The voltage generator 226 may generate an overall bias voltage for a pseudo program operation in response to the program mode P_Mode.

Figure 21:
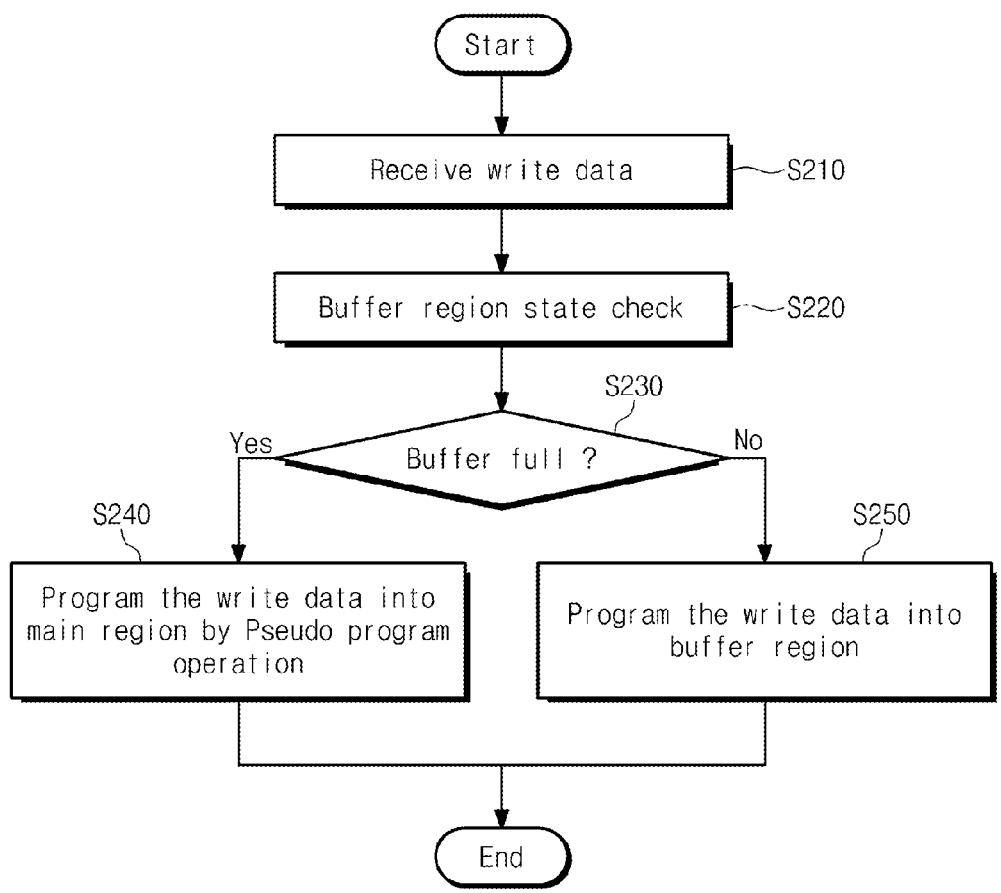
FIG. 21 is a flow chart for reference in describing an example of an operation of a memory system of FIG. 19.

FIG. 21 is a flow chart for reference in describing an operation of a memory system of FIG. 19. In the example of this embodiment, a memory system 200 may selectively perform a pseudo program operation on a main region 221b according to a state of a buffer region 221a. A program operation according to this embodiment of the inventive concept may start in response to a write request from a host.

If a write request is received, in operation S210, a memory controller 210 may receive write requested data. The size of the write data may vary. For example, the write data provided from the host may be data having a relatively small size provided by a random pattern. In this embodiment, however, a pseudo program operation may be executed without regard to the size of write data.

In operation S220, the memory controller 210 may check a current state of the buffer region 221a. For example, the memory controller 210 may determine whether the buffer region 221a is at an erase state or at a program state. This may be performed by searching a mapping table 215. Alternatively, a status read command may be used to check whether the buffer region 221a is at an erase state.

In operation S230, an operation of the memory controller 210 may diverge according to a state of the buffer region 221a. If the buffer region 221a is at a program state, the method may proceed to operation S240. If the buffer region 221a is at an erase/empty state, the method may proceed to operation S250.

In operation S240, the memory controller 210 may program the write requested data at a main region 221b of the nonvolatile memory device 220 according to a pseudo program operation. That is, the memory controller 210 may issue a pseudo program command PP_CMD to program the write requested data at the main region 221b of the nonvolatile memory device 220. In response to the pseudo program command PP_CMD, the nonvolatile memory device 220 may perform a high-speed program operation on a selected memory unit under a bias condition that is different from that of a normal program operation. Then, the memory controller 210 may record one or more page addresses, mapped out due to a pseudo program operation, from among page addresses of the selected memory unit at a mapping table 215.

In operation S250, the memory controller 210 may program the write data at the buffer region 221a. The buffer region 221a may be formed of single level cells for high-speed access and high reliability. Data stored at the buffer region 221a may later be moved to the main region 221b.

As described above, the memory system 200 may determine whether to execute a pseudo program operation according to a state of the buffer region 221a, without regard to a data attribute, data size, data input pattern, and so on, of the input data. In this case, a time taken to erase the buffer region 221a may be reduced as compared to a case where write-requested data is always programmed at the buffer region 221a.

Figure 22:
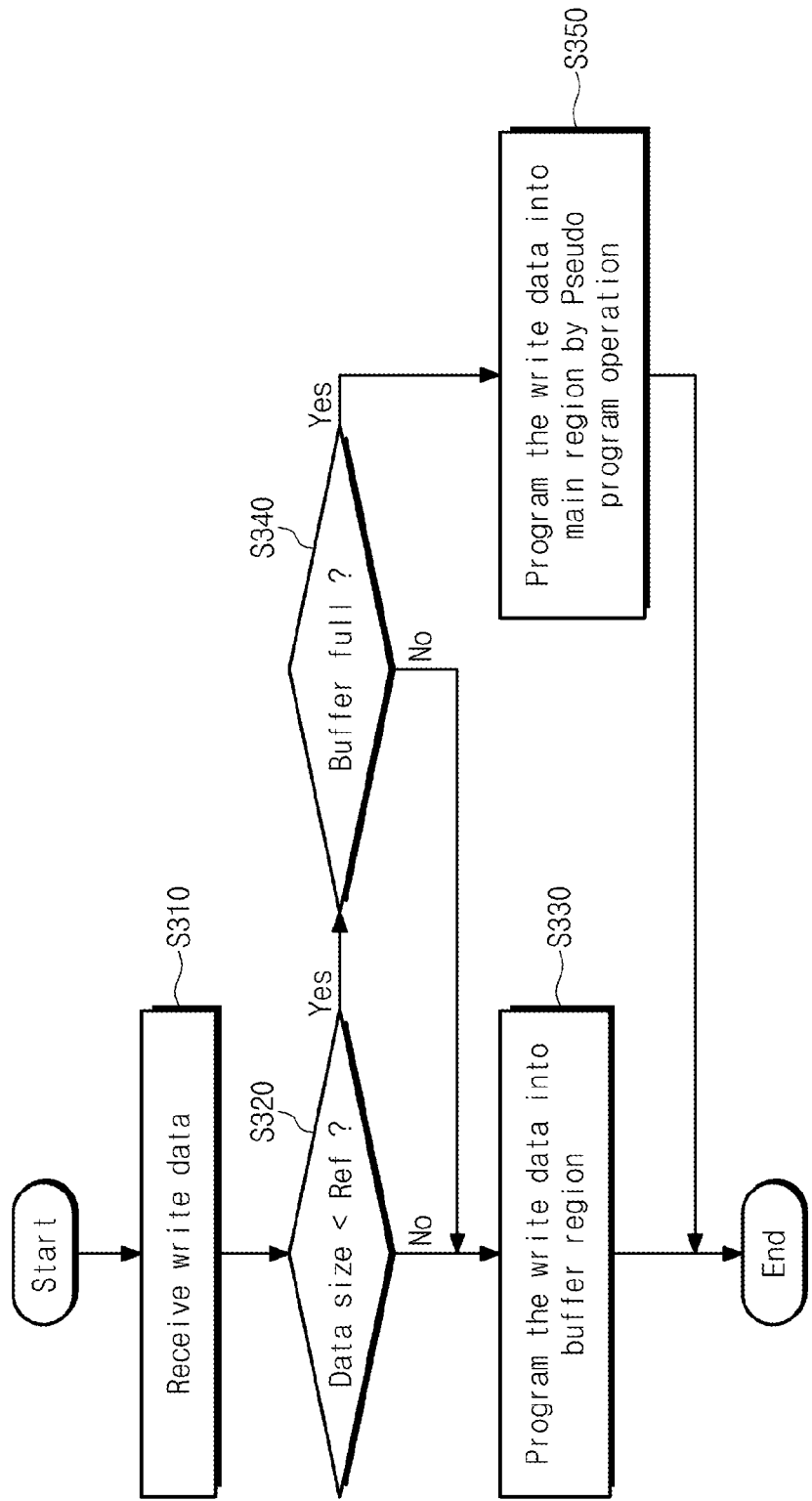
FIG. 22 is a flow chart for reference in describing an example of an operation of a memory system according to another embodiment of the inventive concept.

FIG. 22 is a flow chart for reference in describing an operation of a memory system according to another embodiment of the inventive concept. In the example of this embodiment, a memory system 200 may selectively execute a pseudo program operation on a main region 221b based on a state of a buffer region 221a and a size of write data. A program operation according to this embodiment of the inventive concept may start in response to a write request from a host.

If a write request is received, in operation S310, a memory controller 210 may receive write requested data. This write data may vary in size depending on a number of different factors. For example, the write data may be relatively large in size in the case of sequential data such as media file data. Alternatively, less data may be input from the host in the case where the data is random data that is frequently updated.

In operation S320, the memory controller 210 may compare a size of write data with a reference size. If the size of write data is equal to or larger than the reference size, the method may proceed to operation S330. On the other hand, if the size of write data is smaller than the reference size, the method may proceed to operation S340.

In operation S330, the memory controller 210 may write the write data at the buffer region 221a. At this time, if the buffer region 221a is determined to be at a program state, the memory controller 210 may first perform an erase operation. After the erase operation, programming of the write data into the buffer region 221a may be performed.

In operation S340, the memory controller 210 may check whether the buffer region 221a is at an erase state or at a program state. This operation may be accomplished by searching a mapping table 215. If the buffer region 221a is at a program state, the method may proceed to operation S350. If the buffer region 221a is at an erase/empty state, the method may proceed to operation S330.

In operation S350, the memory controller 210 may program the write requested data at the main region 221b of the nonvolatile memory device 220 according to a pseudo program operation without erasing the buffer region 221a. That is, the memory controller 210 may issue a pseudo program command PP_CMD to program the write requested data at the main region 221b of the nonvolatile memory device 220. In response to the pseudo program command PP_CMD, the nonvolatile memory device 220 may perform a high-speed program operation on a selected memory unit under a bias condition that is different from that of a normal program operation. Then, the memory controller 210 may record one or more page addresses, mapped out due to a pseudo program operation, from among page addresses of the selected memory unit at a mapping table 215.

As described above, the memory system 200 may perform a pseudo program operation according to a state of the buffer region 221a and a size of write data. Alternately, instead of relying on the size of write data, the pseudo program determination may based on data attribute, data input pattern, and so on. That is, a variety of characteristics may be to determine whether to execute the pseudo program operation of the inventive concept.

Figure 23:
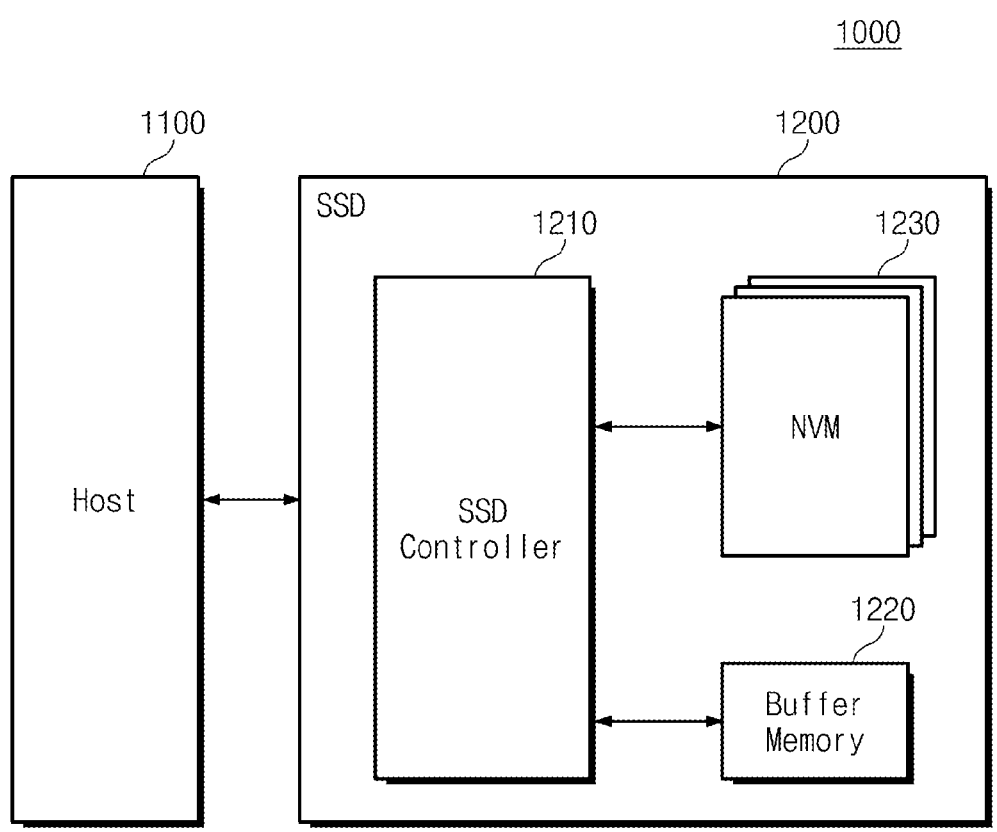
FIG. 23 is a block diagram illustrating a user device including a solid state drive according to an embodiment of the inventive concept.

FIG. 23 is a block diagram illustrating a user device including a solid state drive according to an embodiment of the inventive concept. Referring to FIG. 23, a user device 1000 may include a host 1100 and a solid state drive (hereinafter, referred to as SSD) 1200. The SSD 1200 may include an SSD controller 1210, a buffer memory 1220, and a nonvolatile memory device 1230.

The SSD controller 1210 may provide physical interconnection between the host 1100 and the SSD 1200. The SSD controller 1210 may provide an interface with the SSD 1200 corresponding to a bus format of the host 1100. In particular, the SSD controller 1210 may decode a command provided from the host 1100 to access the nonvolatile memory device 1230 based on the decoding result. The bus format of the host 1100 is not limited, and examples thereof include USB (Universal Serial Bus), SCSI (Small Computer System Interface), PCI express, ATA, PATA (Parallel ATA), SATA (Serial ATA), SAS (Serial Attached SCSI), and the like.

The buffer memory 1220 may temporarily store write data provided from the host 1100 or data read out from the nonvolatile memory device 1230. In the event that data existing in the nonvolatile memory device 1230 is cached, at a read request of the host 1100, the buffer memory 1220 may support a cache function to provide cached data directly to the host 1100. Typically, a data transfer speed of a bus format (e.g., SATA or SAS) of the host 1100 may be higher than that of a memory channel of the SSD 1200. That is, in the event that an interface speed of the host 1100 is significantly fast, lowering of operational performance due to a speed difference may be minimized by providing the buffer memory 1220 having a large storage capacity.

The buffer memory 1220 may be formed of a synchronous DRAM to provide sufficient buffering to the SSD 1200 used as a mass storage device. However, the inventive concept is not limited thereto.

There is described an example in which as a storage medium, the nonvolatile memory device 1230 is formed of a NAND flash memory. For example, the nonvolatile memory device 1230 may be a vertical NAND flash memory device having a mass storage capacity. However, the nonvolatile memory device 1230 is not limited to a NAND flash memory device. For example, a storage medium of the SSD 1200 can be formed of a PRAM, an MRAM, a ReRAM, a FRAM, a NOR flash memory, and the like. Further, the inventive concept may be applied to a memory system which uses different types of memory devices together. The nonvolatile memory device 1230 may be configured substantially the same as that previously described with reference to FIG. 3.

In the SSD 1200, the SSD controller 1210 may perform a pseudo program operation according to a size of write requested data or/and a state of a buffer region of the nonvolatile memory device 1230 as described previously herein.

Figure 24:
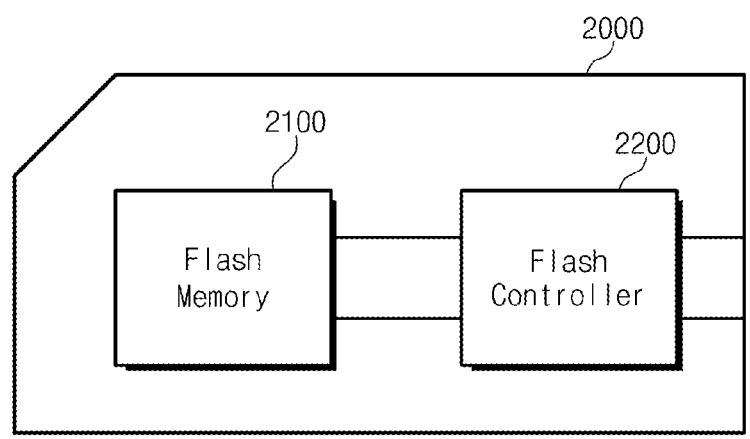
FIG. 24 is a block diagram illustrating a data storage device according to an embodiment of the inventive concept.

FIG. 24 is a block diagram illustrating a data storage device 2000 according to an embodiment of the inventive concept. Referring to FIG. 24, a data storage device 2000 may include a flash memory chip 2100 and a flash controller 2200. The flash controller 2200 may control the flash memory chip 2100 in response to control signals input from external of the data storage device 2000.

The flash memory chip 2100 may be configured substantially the same as a nonvolatile memory device 120 or 220 illustrated in FIG. 3 or 20. The flash memory chip 2100 may be a multi-chip device. The flash memory chip 2100 may have any of a variety of different structures. Examples include a stack flash structure in which arrays are stacked at multiple layers, a source-drain free flash structure, a pin-type flash structure, and a three-dimensional flash structure.

The data storage device 2000 may form a memory card device, an SSD device, a multimedia card device, an SD card, a memory stick device, a HDD device, a hybrid drive device, or an USB flash device. For example, the data storage device 2000 may form a card which satisfies industry standards for using user devices such as a digital camera, a personal computer, and so on.

Here, the flash controller 2200 may perform a pseudo program operation according to a size of write requested data or/and a state of a buffer region of the flash memory chip 2100 as described previously herein.

Figure 25:
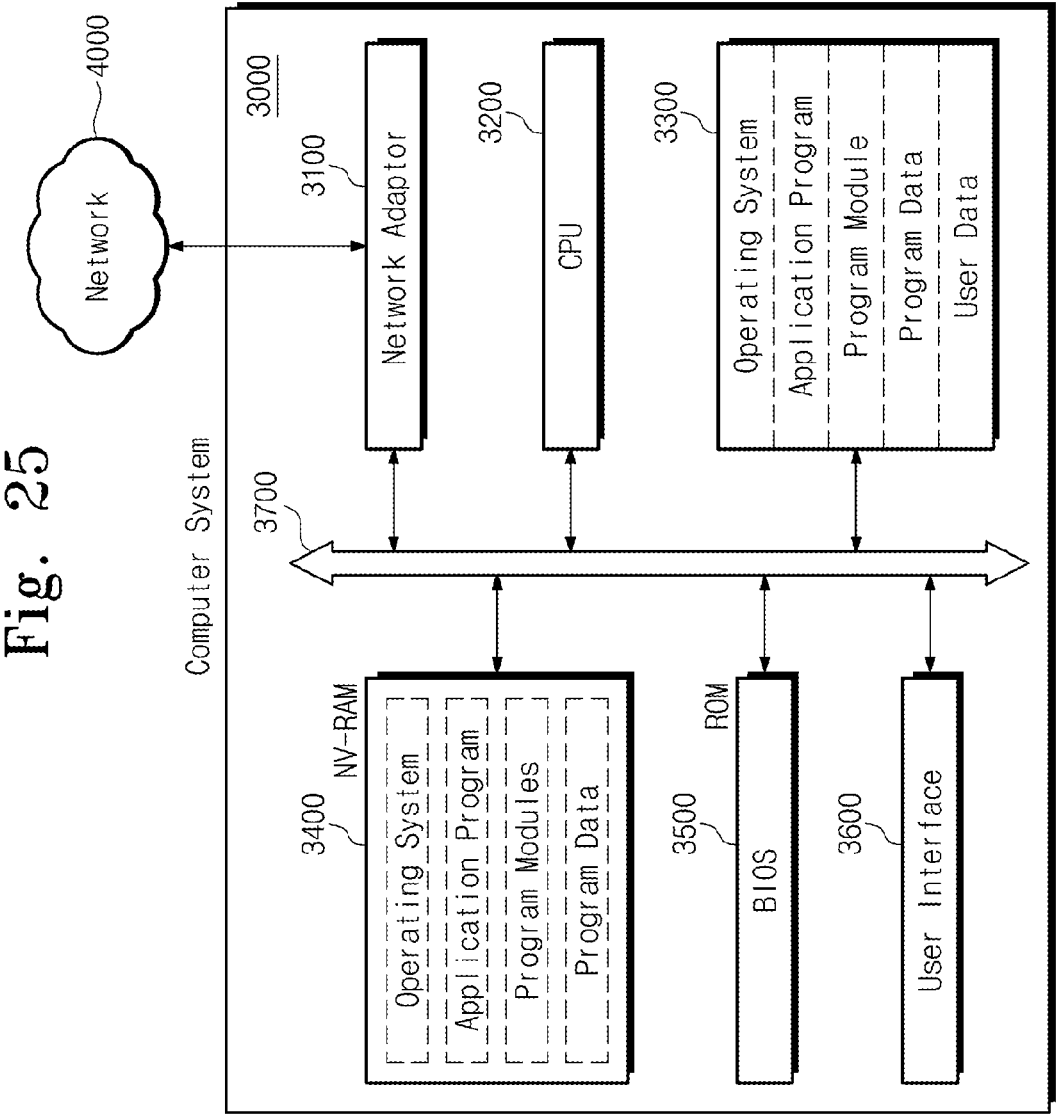
FIG. 25 is a block diagram schematically illustrating a computing system according to an embodiment of the inventive concept.

FIG. 25 is a block diagram schematically illustrating a computing system according to an embodiment of the inventive concept. Referring to FIG. 25, a computing system 3000 may include a network adaptor 3100, a CPU 3200, a mass storage device 3300, a RAM 3400, a rom 3500, and a user interface 3600 which are connected with a bus 3700.

The network adaptor 3100 may provide an interface between the computing system 3000 and external networks 4000. The CPU 3200 may control an overall operation for driving an operating system and an application program which are resident on the RAM 3400. The data storage device 3300 may store data needed for the computing system 3000. For example, the data storage device 3300 may store an operating system for driving the computing system 3000, an application program, various program modules, program data, user data, and so on.

The RAM 3400 may be used as a working memory of the computing system 3000. Upon booting, the operating system, the application program, the various program modules, and program data necessary to execute programs and program modules read out from the data storage device 3300 may be loaded on the RAM 3400. The ROM 3500 may store a basic input/output system (BIOS) which is activated before the operating system is driven upon booting. Information exchange between the computing system 3000 and a user may be made via the user interface 3600.

In addition, the computing system 3000 may further include a battery, a modem, and the like. Although not shown in FIG. 25, the computer system 3000 may further include various other devices, such as an application chipset, a camera image processor (CIS), a mobile DRAM, and the like.

The mass storage device 3300 may be implemented by a solid state drive, a multimedia card (MMC), a secure digital (SD) card, a micro SD card, a memory stick, an ID card, a PCMCIA card, a chip card, an USB card, a smart card, a compact flash (CF) card, and so on. The mass storage device 3300 may perform a pseudo program operation according to a size of write requested data or/and a state of a buffer region as described previously herein.

Although not shown in FIG. 25, the computing system 3000 according to the inventive concept may further comprise other devices such as an application chipset, a camera image processor (CIS), a mobile DRAM, and so on.

A nonvolatile memory device and/or a memory controller may be packaged according to any of a variety of different packaging technologies. Examples include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A memory system, comprising:
   a nonvolatile memory device configured to program memory cells with multi-bit data during a program cycle; and
   a memory controller configured to control the nonvolatile memory device such that memory cells connected with a selected row of the nonvolatile memory device are programmed in accordance with a write command by one of a first program mode and a second program mode,
   wherein at the first program mode, a plurality of logical pages corresponding in number to a maximum page number is stored at the memory cells; and
   wherein at the second program mode, one or more logical pages the number of which is less than the maximum page number are stored at the memory cells using a bias condition that is different from that used in the first program mode,
   wherein at the second program mode, the memory cells are programmed to have an erase state or a pseudo program state, and the pseudo program state is allocated to be disposed between read voltages, having a widest voltage window, from among read voltages for reading a logical page mapped on the memory cells.

2. The memory system of claim 1, wherein the logical pages corresponding in number to the maximum page number are respectively mapped when addresses of the memory cells are mapped in the first program mode; and
   wherein at least one of the logical pages corresponding in number to the maximum page number is mapped out in the second program mode.

3. The memory system of claim 2, wherein at the first program mode, two logical pages are allocated to the memory cells; and
   wherein at the second mode, an MSB page among the two logical pages is allocated for address mapping and an LSB page among the two logical pages is mapped out.

4. The memory system of claim 1, wherein at the first program mode, three logical pages are allocated to the memory cells; and
   wherein at the second program mode, one of LSB and MSB pages among the three logical pages is allocated for address mapping.

5. The memory system of claim 4, wherein the pseudo program state comprises first pseudo program states, and at the second program mode, the memory cells are programmed to have the erase state and the first pseudo program states.

6. The memory system of claim 5, wherein each of the first pseudo program states is allocated to be disposed between read voltages, having the widest voltage window, from among read voltages for respectively reading logical pages mapped on the memory cells.

7. The memory system of claim 2, wherein at the first program mode, three logical pages are allocated to the memory cells; and
   wherein at the second program mode, LSB and MSB pages of the three logical pages are allocated for address mapping.

8. The memory system of claim 7, wherein the pseudo program state comprises first, second and third pseudo program states, and at the second program mode, the memory cells are programmed to have one of the erase state, the first pseudo program state, the second pseudo program state, and the third pseudo program state.

9. The memory system of claim 1, wherein at the first program mode, four logical pages are allocated to the memory cells; and
   wherein at the second program mode, an LSB page among the four logical pages is allocated for address mapping.

10. The memory system of claim 9, wherein the pseudo program state comprises a first pseudo program state, and at the second program mode, the memory cells are programmed to have the erase state and the first pseudo program state.

11. The memory system of claim 10, wherein the first pseudo program state is allocated to be disposed between read voltages, having the widest voltage window, from among read voltages for reading a logical page mapped on the memory cells.

12. The memory system of claim 1, wherein at the first program mode, four logical pages are allocated to the memory cells at a mapping table; and
   wherein at the second program mode, at least two logical pages, including an MSB page, among the four logical pages are allocated for address mapping.

13. The memory system of claim 12, wherein the pseudo program state comprises first, second and third pseudo program states, and at the second program mode, the memory cells are programmed to have one of the erase state, the first pseudo program state, the second pseudo program state, and the third pseudo program state.

14. The memory system of claim 1, wherein the bias condition includes at least one of an increment of a program voltage, a start program voltage, a number of verification voltage pulses and a number of program loops of each of the first and second program modes.

15. A memory system, comprising:
a nonvolatile memory device including a memory cell array and configured to program logical N-pages of data in memory cells connected to a same word line of the memory cell array, where N is an integer of two or more;
a memory controller configured to receive an externally supplied write command and write requested data, and to control the nonvolatile memory device in a selected one of a normal program mode and a pseudo program mode,
wherein in the normal program mode, the memory controller controls the nonvolatile memory device to store the write requested data as N-bit data in the memory cells connected to the same word line of the memory cell array, and
wherein in the pseudo program mode, the memory controller controls the nonvolatile memory device to store the write requested data as less-than-N-bit data in the memory cells connected to the same word line of the memory cell array, and
wherein at least one bias condition of the pseudo program mode is different from at least one bias condition of the normal program mode such that a program speed of the pseudo program mode is greater than a program speed of the normal program mode.

16. The memory system of claim 15, wherein the memory controller comprises a mapping table mapping the N-logical pages, and wherein the memory controller is configured to map out, in the mapping table, logical pages among the N-logical pages that are not allocated in the pseudo program mode.

17. The memory system of claim 15, wherein the normal program mode or the pseudo program mode is selected based on at least one of a size, an attribute and a relative importance of the write requested data.

18. A program method of a nonvolatile memory device which programs plural pages of data in a one-shot program mode, comprising:
comparing a size of write requested data with a reference size;
issuing a pseudo program command on the write requested data to the nonvolatile memory device when a size of the write requested data is smaller than the reference size;
programming selected memory cells with the write requested data under a pseudo program mode in accordance with the pseudo program command; and
mapping out a page address of a logical page area, excluded by the pseudo program mode, from among a plurality of logical page areas included in the selected memory cells at a mapping table,
wherein a program state of memory cells formed according to the pseudo program mode has a characteristic threshold voltage distribution that is different from a characteristic threshold voltage distribution formed according to the one-shot program mode, and at least one bias condition of the pseudo program mode is set so that a program speed of the pseudo program mode is greater than a program speed of the one-shot program mode.

19. The program method of claim 18, wherein the program state of memory cells formed according to the pseudo program mode includes an erase state and at least one pseudo program state, the at least one pseudo program state being disposed between read voltages, forming a widest voltage window, from among read voltages of an allocated logical page.

* * * * *